(12) United States Patent  
Wakabayashi et al.

(10) Patent No.: US 10,471,683 B2  
(45) Date of Patent: Nov. 12, 2019

(54) ELECTRONIC DEVICE

(71) Applicant: Fujitsu Optical Components Limited, Kawasaki-shi, Kanagawa (JP)

(72) Inventors: Kazuyuki Wakabayashi, Kawasaki (JP); Toshihiro Ohtani, Yokohama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 16/166,438

(22) Filed: Oct. 22, 2018

(65) Prior Publication Data

US 2019/0118511 A1 Apr. 25, 2019

(30) Foreign Application Priority Data

Oct. 23, 2017 (JP) .................. 2017-204639

(51) Int. Cl.
| | |
|---|---|
| *H01L 23/373* | (2006.01) |
| *B23B 9/00* | (2006.01) |
| *B32B 9/00* | (2006.01) |
| *B32B 3/02* | (2006.01) |
| *B32B 7/12* | (2006.01) |
| *H05K 7/20* | (2006.01) |
| *H05K 1/02* | (2006.01) |
| *H01L 23/367* | (2006.01) |

(52) U.S. Cl.
CPC ............. *B32B 9/007* (2013.01); *B32B 3/02* (2013.01); *B32B 7/12* (2013.01); *H01L 23/373* (2013.01); *H05K 1/0204* (2013.01); *H05K 1/0209* (2013.01); *H05K 7/20481* (2013.01); *B32B 2307/302* (2013.01); *H01L 23/3672* (2013.01)

(58) Field of Classification Search
CPC ......... H01L 23/373; H01L 2224/32145; H01L 23/3735; H01L 23/367; H01L 29/1606; H01L 2924/01006; G06F 1/203; G06F 1/20; G06F 1/206; H05K 2201/0323; H05K 1/0203; H05K 7/2039; H05K 7/20963; H05K 1/0204; H05K 2201/066; H05K 7/20481; H05K 7/20472
See application file for complete search history.

(56) References Cited

U.S. PATENT DOCUMENTS

| | | | |
|---|---|---|---|
| 9,293,428 B2 * | 3/2016 | Sauciuc | ............... H01L 23/36 |
| 2007/0102142 A1 | 5/2007 | Reis et al. | |
| 2008/0198547 A1 * | 8/2008 | Tomioka | .............. G06F 1/203 |
| | | | 361/679.54 |
| 2015/0077957 A1 * | 3/2015 | Sakatani | ................ B32B 7/12 |
| | | | 361/757 |

(Continued)

FOREIGN PATENT DOCUMENTS

JP 2012-141093 7/2012

OTHER PUBLICATIONS

Patent Abstracts of Japan English abstract corresponding to Japanese Patent Publication No. 2012-141093, published Jul. 26, 2012.

*Primary Examiner* — Adam B Dravininkas

(74) *Attorney, Agent, or Firm* — Staas & Halsey LLP

(57) ABSTRACT

A disclosed electronic device includes a graphite laminate having a plurality of layers laminated in a first direction, each layer containing graphite, where the graphite laminate has a portion in a stepwise form in which edges of the plurality of layers are offset from each other.

9 Claims, 21 Drawing Sheets

(56) References Cited

U.S. PATENT DOCUMENTS

| | | | |
|---|---|---|---|
| 2015/0096732 A1* | 4/2015 | Teo | G02B 6/4266 |
| | | | 165/185 |
| 2015/0279577 A1* | 10/2015 | Uchida | H01M 10/0569 |
| | | | 429/336 |
| 2016/0172008 A1* | 6/2016 | Rugg | H05K 7/20518 |
| | | | 360/97.12 |
| 2016/0343466 A1 | 11/2016 | Wu | |
| 2018/0063996 A1* | 3/2018 | Vitale | G06F 1/203 |
| 2018/0226252 A1* | 8/2018 | Ifuku | H01L 21/302 |

\* cited by examiner

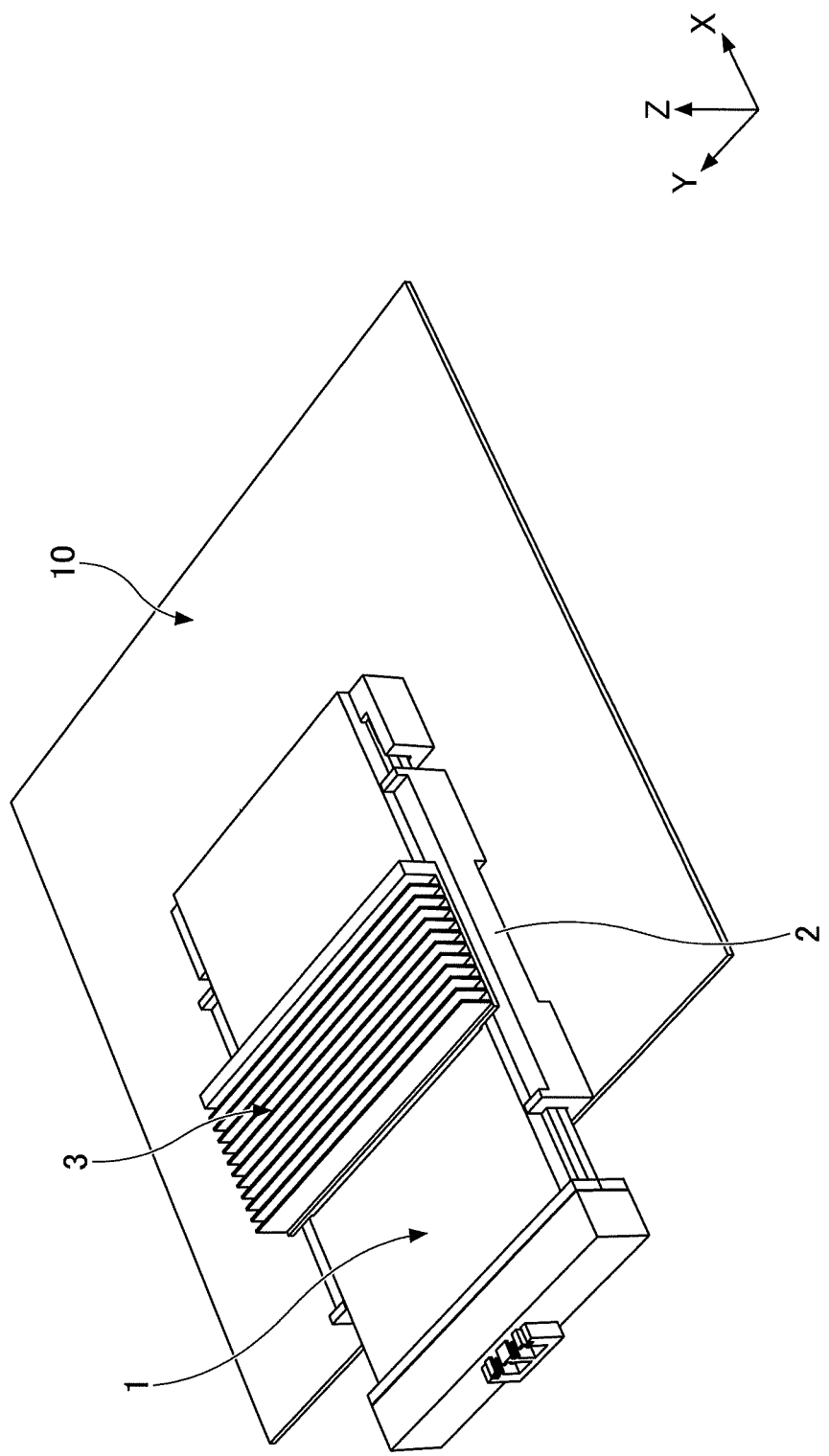

ELECTRONIC DEVICE

CROSS-REFERENCE TO RELATED APPLICATION

This patent application is based on and claims priority to Japanese patent application No. 2017-204639 filed on Oct. 23, 2017, the entire contents of which are incorporated herein by reference.

FIELD

The disclosures discussed herein relate to an electronic device.

BACKGROUND

With respect to a graphite laminate in which layers each containing graphite are laminated, a technique for implementing high thermal conductivity between layers is known in the art.

Due to low thermal conductivity (approximately several W/(m·K)) of each layer in the thickness direction and an effect from contact thermal resistance between layers, the graphite laminate may have difficulty in increasing the heat transport capability in proportion to the number of layers.

RELATED ART DOCUMENTS

Patent Documents

Patent Document 1: U.S. Patent Publication No. 2016/0343466
Patent Document 2: U.S. Patent Publication No. 2007/0102142

SUMMARY

According to an aspect of embodiments, an electronic device includes a graphite laminate having a plurality of layers laminated in a first direction, each layer containing graphite, wherein the graphite laminate has a portion in a stepwise form in which edges of the plurality of layers are offset from each other.

The object and advantages of the invention will be realized and attained by means of the elements and combinations particularly pointed out in the appended claims.

It is to be understood that both the foregoing general description and the following detailed description are exemplary and explanatory and are not restrictive of the invention.

BRIEF DESCRIPTION OF THE DRAWINGS

FIG. 1A is a diagram illustrating an example of an optical transceiver in an installed state.

DESCRIPTION OF EMBODIMENTS

According to at least one aspect of the present invention, a heat transport capability of a graphite laminate may be enhanced.

The following illustrates embodiments in detail with reference to the accompanying drawings.

First Embodiment

Figure 1B:
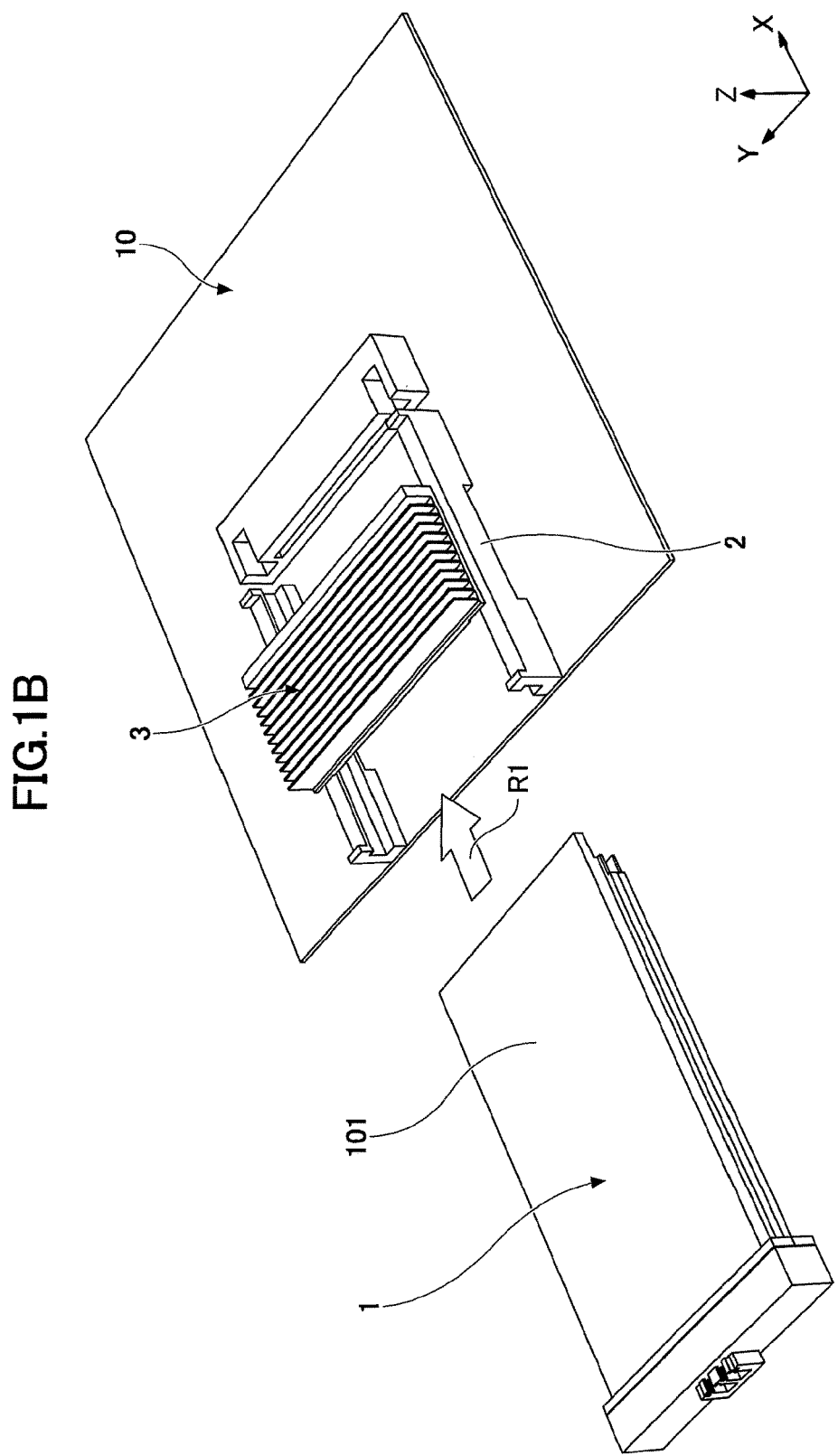
FIG. 1B is a diagram illustrating a state before an optical transceiver being installed.

FIG. 1A is a diagram illustrating an example of an optical transceiver in an installed state, and FIG. 1B is a diagram illustrating a state before an optical transceiver being installed. In FIGS. 1A and 1B, X, Y, and Z directions are illustrated as three orthogonal directions. Note that the X direction may herein be considered as a positive X direction or a negative X direction depending on context; the same may apply to the Y and Z directions. In the following description, a positive side in the Z direction (an example of a first direction) is referred to as an "upper side" for the convenience of explanation, but an orientation of an optical transceiver 1 in an installed sate may be any direction.

The optical transceiver 1 is a device for mutually converting an electric signal and an optical signal. The optical transceiver 1 is installed (inserted) into a cage 2 of an optical transmission device for optical communication as indicated by an arrow R1 in FIG. 1B. Note that a plurality of devices other than the optical transceiver 1 may be installed in the optical transmission device. The cage 2 is disposed on the substrate 10 of the optical transmission device, for example. The cage 2 is provided with a heat sink 3. The heat sink 3 is configured to have a plurality of fins. In the first embodiment, for example, the heat sink 3 is disposed only in a part of the cage 2 in the X direction. However, in modifications, the heat sink 3 may be disposed over the entirety of the cage 2 in the X direction.

Figure 2:
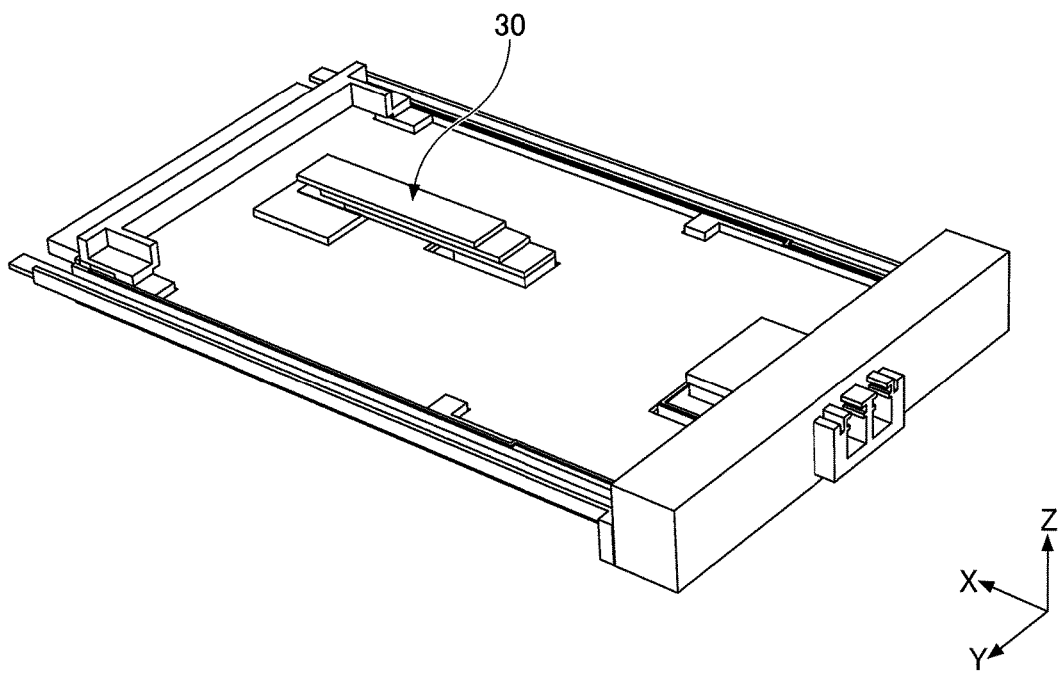
FIG. 2 is a perspective view of an optical transceiver.
Figure 3:
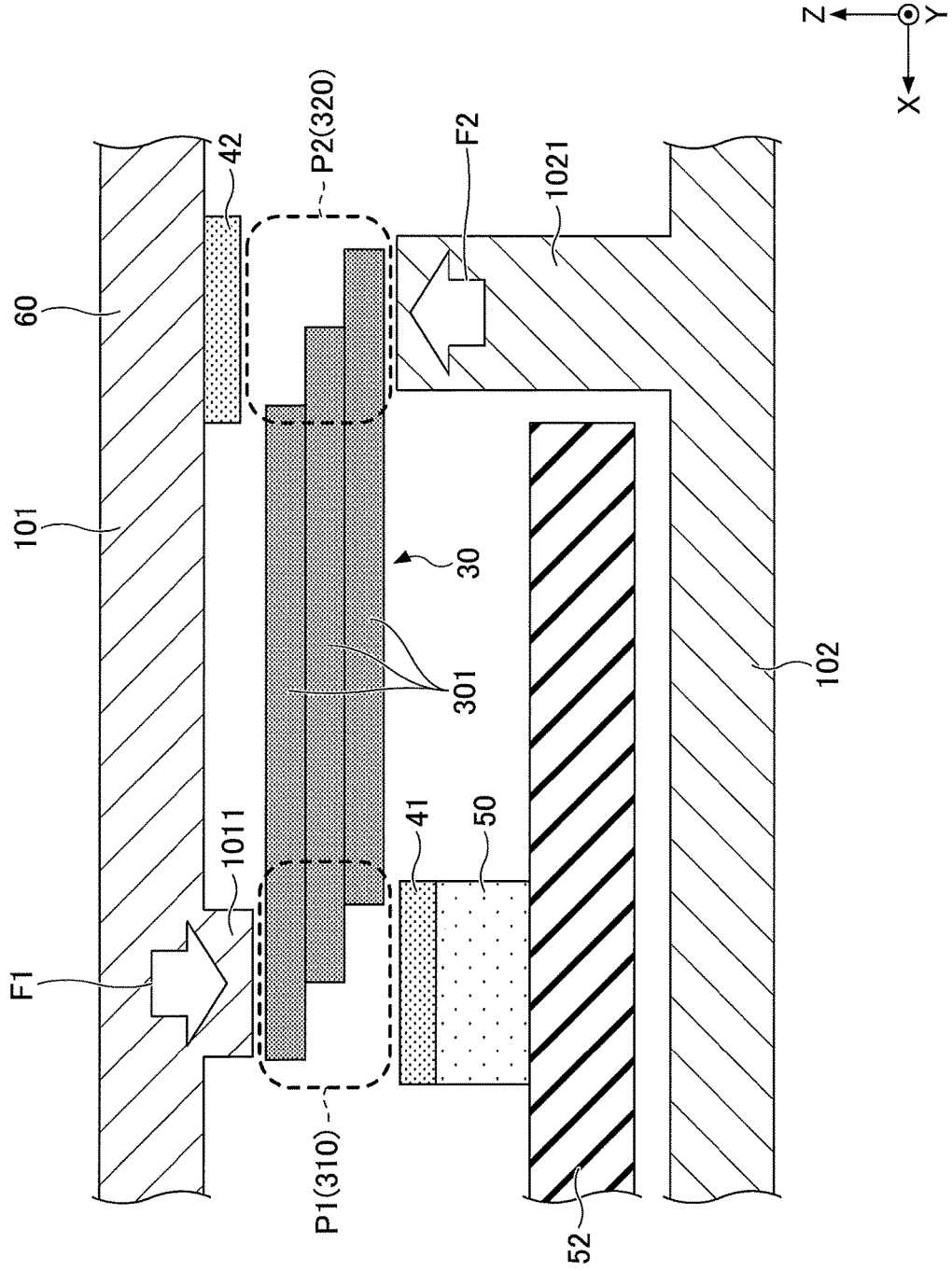
FIG. 3 is a schematic cross-sectional view of an optical transceiver.

FIG. 2 is a perspective view of the optical transceiver 1. In FIG. 2, illustration of an upper housing 101 (see FIG. 1) of the optical transceiver 1 and a heat transfer sheet 42 of the upper housing 101 is omitted. FIG. 3 is a schematic cross-sectional view of the optical transceiver 1, which is a cross-sectional view along an XZ plane passing through a later described graphite laminate. FIG. 3 schematically illustrates a cross-sectional view of a state before the upper housing 101 is assembled (the upper housing 101 being in a state slightly away from the lower housing 102 in the Z direction). In addition, FIG. 3 is a sectional view of only a part of the optical transceiver 1 in the X direction (a portion corresponding to the graphite laminate 30), not the entirety of the optical transceiver 1 in the X direction. The same applies to other similar sectional views (FIG. 6 etc.) to be described later.

The optical transceiver 1 includes a housing including an upper housing 101 and a lower housing 102. Note that various components to be described later including a heat source 50 are housed in the housing. The heat source 50 is a heat generating component and may be a processing device such as an LSI (Large-Scale Integration) or the like. In the example illustrated in FIG. 3, the heat source 50 is installed on the substrate 52.

An upper surface of the upper housing 101 comes in contact with the heat sink 3 (see FIGS. 1 and 2). Hereinafter, a portion of the upper housing 101 that comes in contact with the heat sink 3 is also referred to as a "heat radiation portion 60". In this case, a position of the heat radiation portion 60 is determined in accordance with a position of the heat sink 3.

The optical transceiver 1 includes a graphite laminate 30. The graphite laminate 30 is formed by laminating respective layers 301 containing graphite in the Z direction. The respective layers 301 may be joined with an adhesive, an adhesive tape, or the like. In this case, the respective layers 301 may be joined throughout, or the respective layers may be joined only in a region related to stepwise portions 310 and 320 described later or only in other regions.

In the first embodiment, the graphite laminate 30 includes three layers 301 as illustrated in FIG. 3, for example. The layers 301 are each made of, for example, sheet-like graphite (graphite sheet). The graphite sheet has advantages of high flexibility in shape and high plasticity. The graphite sheet may be as thin as several tens of micrometers, for example.

In the graphite laminate 30, the plurality of layers 301 have edges (edges in the X direction in the example of FIG. 3) which are offset from each other to form respective stepwise forms, which correspond to the stepwise portions 310 and 320 (portions in P1 and P2 in FIG. 3). Hereinafter, a stepwise form indicates a form in which a step in the Z direction is formed as edges of layers that are offset from each other in this manner.

In the first embodiment, for example, as illustrated in FIG. 2, the graphite laminate 30 extends in the X direction such that the X direction is a longitudinal direction. However, in the modifications, the graphite laminate 30 may extend in the X direction such that a Y direction or another direction is the longitudinal direction.

As illustrated in FIG. 3, the stepwise portion 310 (an example of the first portion) forms an end portion of the graphite laminate 30 toward a positive X direction (an example of a second direction). The stepwise portion 310 is thermally connected to the heat source 50. The stepwise portion 310 has a plurality of layers 301 forming a downward stepwise form. That is, the layers 301 form a stepwise form to expose respective lower surfaces of the layers 301 in the stepwise portion 310. The lower surfaces of the layers 301 in the stepwise portion 310 are connected with the heat source 50 in the Z direction via a heat transfer sheet 41 (an example of the first heat transfer member).

Figure 4:
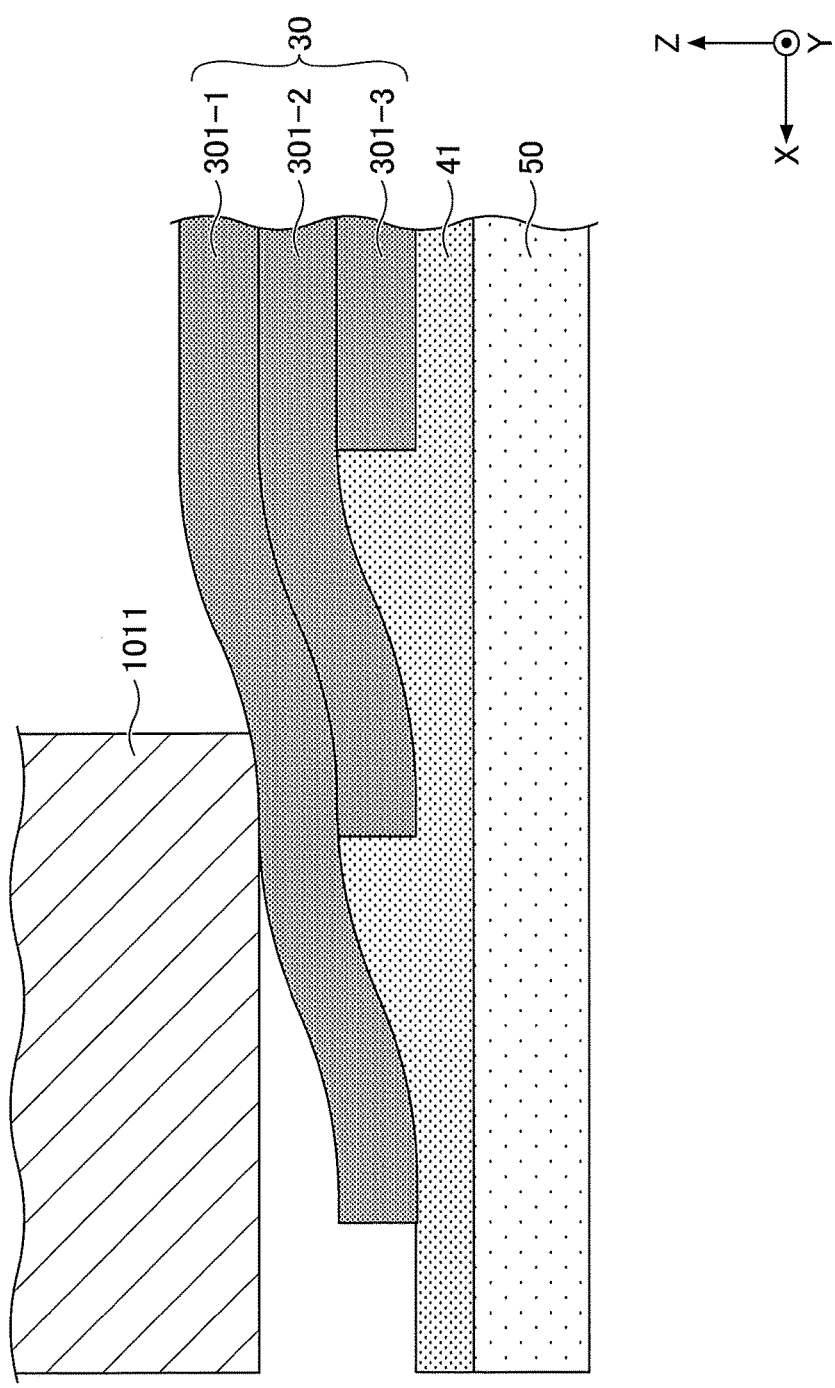
FIG. 4 is a view illustrating an effect of a stepwise portion.

The heat transfer sheet 41 may be made of, for example, a thermal sheet, a thermal interface material (TIM), or the like. Hereinafter, the heat transfer sheet 41 is assumed to be made of TIM, for example. In an assembled state, the heat transfer sheet 41 is deformed by being applied with a load in the Z direction (see load F1 in FIG. 3). The deformed heat transfer sheet 41 (see FIG. 4 schematically illustrating a deformed state) has a function of enhancing heat conductivity between the heat source 50 and the stepwise portion 310 by bridging (embedding) a minute gap between the heat source 50 and the stepwise portion 310.

The stepwise portion 310 preferably contacts the upper housing 101 in the Z direction at a position opposite to the heat source 50 in the Z direction. A portion (an example of the first contact portion) of the upper housing 101 that comes in contact with the stepwise portion 310 may be a flat portion flush with a peripheral portion, but may preferably be a portion protruding from the peripheral portion. In the example illustrated in FIG. 3, the upper housing 101 has a protruded portion 1011 that protrudes downward, and the lower surface of the protruded portion 1011 is in contact with the stepwise portion 310 in the Z direction. The upper housing 101 is preferably assembled with respect to the lower housing 102 so as to apply a downward load to the stepwise portion 310, as indicated by the load F1 in FIG. 3. In this case, the stepwise portion 310 is pressed against the heat source 50 via the heat transfer sheet 41 to efficiently increase the amount of heat to be transferred from the heat source 50 to the graphite laminate 30 via the stepwise portion 310.

As illustrated in FIG. 3, a stepwise portion 320 (an example of a second portion) has an end portion (an end portion on the opposite side to the stepwise portion 310) of the graphite laminate 30 in a negative X direction (an example of a third direction). The stepwise portion 320 is thermally connected to a heat radiation portion 60. The stepwise portion 320 has a plurality of layers 301 forming an upward stepwise form. That is, the layers 301 form a stepwise form to expose respective upper surfaces of the layers 301 in the stepwise portion 320. The upper surfaces of layers of the layers 301 in the stepwise portion 320 are connected with the heat radiation portion 60 in the Z direction via a heat transfer sheet 42 (an example of the second heat transfer member).

In this embodiment, for example, the stepwise portion 320 forms an end portion on the side opposite to the stepwise portion 310, thus toward the X direction (an example of the second portion and the third direction); however, in the modifications, the stepwise portion 310 and the stepwise portion 320 may each form an end portion toward any direction orthogonal to the Z direction, for example, any direction within an XY plane. In this case, the stepwise portion 310 and the stepwise portion 320 need not act as end portions in the same direction. For example, the stepwise portion 310 may form an end portion of the graphite laminate 30 toward the positive X direction and the stepwise portion 320 may form an end portion of the graphite laminate 30 toward a Y direction.

The heat transfer sheet 42 may be made of, for example, a thermal sheet, a thermal interface material (TIM), or the like. Hereinafter, the heat transfer sheet 42 is assumed to be made of TIM, for example. In an assembled state, the heat transfer sheet 42 is deformed by being applied with a load in the Z direction (see load F2 in FIG. 3). The deformed heat transfer sheet 42 has a function of enhancing heat conductivity between the heat radiation part 60 and the stepwise portion 320 by bridging (embedding) a gap between the heat radiation part 60 and the stepwise portion 320.

The stepwise portion 320 preferably contacts the lower housing 102 in the Z direction at a position opposite to the heat radiation portion 60 in the Z direction. A portion (an example of the second contact portion) of the lower housing 102 that is in contact with the stepwise portion 320 may be a flat portion flush with a peripheral portion, but may preferably be a portion protruding from the peripheral portion. In the example illustrated in FIG. 3, the lower housing 102 has a protruded portion 1021 that protrudes upward, and the upper surface of the protruded portion 1021 is in contact with the stepwise portion 320 in the Z direction. The lower housing 102 is preferably assembled with respect to the upper housing 101 so as to apply an upward load to the stepwise portion 320, as indicated by the load F2 in FIG. 3. In this case, the stepwise portion 320 is pressed against the heat radiation portion 60 via the heat transfer sheet 42 to efficiently increase the amount of heat to be transferred from the heat radiation portion 60 to the graphite laminate 30 via the stepwise portion 320.

FIG. 4 is a view illustrating an effect of the stepwise portion 310, which is a cross-sectional view schematically illustrating a state of the stepwise portion 310 and the heat transfer sheet 41 between the heat source 50 and the upper housing 101. FIG. 4 schematically illustrates a cross sectional view in a state in which the upper housing 101 is assembled, which differs from FIG. 3. With reference to FIG. 4, the stepwise portion 310 is illustrated; however, the same description is also applied to a stepwise portion 320. In FIG. 4, the respective layers 301 may also be referred to as an upper layer 301-1, an intermediate layer 301-2, and a lower layer 301-3 in the order from the upper side for distinction.

In the stepwise portion 310, as described above, an edge of the lower layer 301-3 and an edge of the intermediate layer 301-2 are offset from each other, and an edge of the intermediate layer 301-2 and an edge of the upper layer 301-1 are offset from each other. In this case, the intermediate layer 301-2 extends to the outside (a side away from the center in the X direction of the graphite laminate 30) more than the edge of the lower layer 301-3, and the upper layer 301-1 extends to the outside more than the edge of the intermediate layer 301-2.

Accordingly, as illustrated in FIG. 4, the intermediate layer 301-2 is enabled to be connected with the heat source 50 in the Z direction via the heat transfer sheet 41 outside the edge of the lower layer 301-3. In addition, the upper layer 301-1 is enabled to be connected with the heat source 50 in the Z direction via the heat transfer sheet 41 outside the edge of the intermediate layer 301-2.

According to the first embodiment, each of layers 301 of the graphite laminate 30 is enabled to be connected with the heat source 50 in the Z direction only via the heat transfer sheet 41 in the stepwise portion 310.

Figure 5:
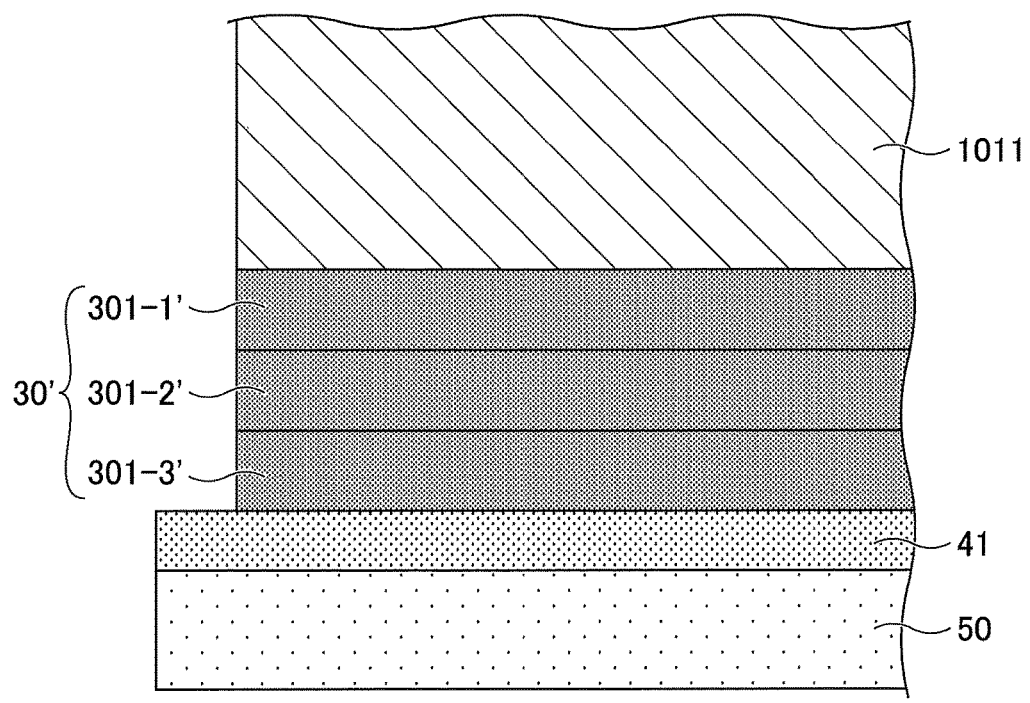
FIG. 5 is a view illustrating a comparative example.

FIG. 5 is a view illustrating a comparative example. The comparative example is different from the first embodiment in that the comparative example does not have the stepwise portions 310 and 320. In a graphite laminate 30' of the comparative example illustrated in FIG. 5, an upper layer 301-1' is connected with the heat source 50 in the Z direction via the intermediate layer 301-2' and the lower layer 301-3', and the intermediate layer 301-2' is connected with the heat source 50 in the Z direction via the lower layer 301-3'.

In general, it is difficult for a graphite laminate to increase a heat transport capability in proportion to the number of layers, due to low thermal conductivity (approximately several W/(m·K)) of each layer in the thickness direction as well as an effect from high contact thermal resistance between layers.

Accordingly, in the comparative example illustrated in FIG. 5, the upper layer 301-1' and the intermediate layer 301-2' fail to efficiently receive heat from the heat source 50, and despite having three layers, a heat transport capability does not increase significantly. That is, heat is conducted only from the heat source 50 to the lower layer 301-3' via the heat transfer sheet 41, and due to a high contact heat resistance between the layers, heat transferred from the lower layer 301-3' to the upper layer 301-1' and to the intermediate layer 301-2' does not increase. As a result, the upper layer 301-1' and the intermediate layer 301-2' fail to efficiently transport heat from the heat source 50.

By contrast, according to the first embodiment, as described above, not only the lower layer 301-3 but also the upper layer 301-1 and the intermediate layer 301-2 are connected with the heat source 50 only via the heat transfer sheet 41 in the Z direction. Thus, according to the first embodiment, not only the lower layer 301-3 but also the upper layer 301-1 and the intermediate layer 301-2 are enabled to efficiently transport heat from the heat source 50. That is, according to the first embodiment, as compared with the graphite laminate 30' of the comparative example illustrated in FIG. 5, the amount of heat transferred from the heat source 50 to the graphite laminate 30 via the stepwise portion 310 will be efficiently increased. In addition, since heat transport in the graphite laminate 30 is independently performed mainly in each of the layers 301 in this manner, high contact thermal resistance between the layers 301 will not be a substantial problem. As a result, according to the first embodiment, it is possible to increase a heat transport capability of the graphite laminate 30 from the heat source 50 to the heat radiation portion 60, as compared with the comparative example illustrated in FIG. 5.

In addition, according to the first embodiment, by applying the loads F1 and F2 via the protruded portions 1011 and 1021, a heat transport capability of the graphite laminate 30 from the heat source 50 to the heat radiation portion 60 will be enhanced. That is, since each of the layers 301 of graphite laminate 30 is thin, for example, approximately several tens of micrometers in thickness, and has flexibility, sufficient contact at a contact point may be implemented by the application of the loads F1 and F2. Such contact is further stabilized by deformation of the heat transfer sheet 41 described above.

Note that in recent years, optical modules such as the optical transceiver 1 have rapidly become down-sized with expanding application to data centers, and the power consumption per unit volume has been increasing. Hence, a countermeasure against heat that controls internal parts or components within a rated temperature range is useful.

However, due to high-density packaging accompanying downsizing, flexibility in component installation tends to decrease, and it is presumed that a heat generating component (e.g., heat source 50) may fail to be installed in an appropriate area for radiating heat. That is, a significant distance tends to occur between the heat radiation portion and the heat generating component. Moreover, due to the original volume inside the original optical module being small and the high density internal component packaging, it may be difficult to use heat pipes, which have limitations in terms of size and flexibility as a heat transport unit.

In this regard, according to the first embodiment, by using the graphite laminate 30 described above, it is possible to provide a high heat transport capability also to an optical module such as the optical transceiver 1 for which high density packaging accompanying downsizing is advanced.

Next, some modifications with respect to the above-described first embodiment will be described. In the following description of the modifications, the same reference numerals are applied to elements that may be similar to those of the above-described first embodiment, and the description of these elements may be omitted in some cases.

First Modification

Figure 6:
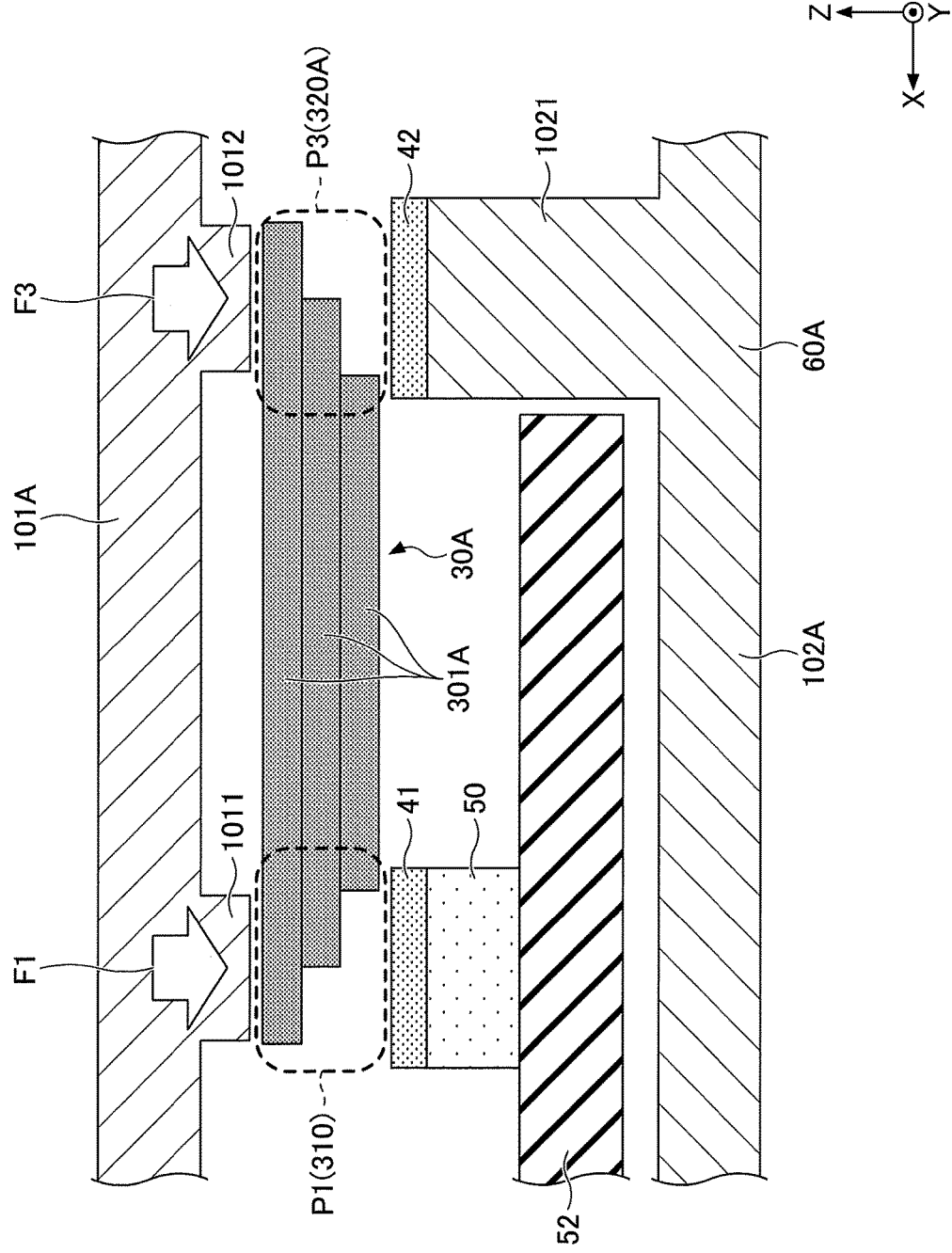
FIG. 6 is a view illustrating a first modification.

In a first modification, a similar heat radiation portion 60A is formed on a lower housing 102A. In this case, as illustrated in FIG. 6, a stepwise portion 320A of the graphite laminate 30A has a plurality of layers 301A forming a downward stepwise form, similarly to the stepwise portion 310. Lower surfaces of the respective layers 301A in the stepwise portion 320A are connected with a protruded portion 1021 in the Z direction via a heat transfer sheet 42. In this manner, the stepwise portion 320A is enabled to be thermally connected to the heat radiation portion 60A on the lower housing 102A side via the protruded portion 1021. Also in this case, each of the layers 301A of the graphite laminate 30A in the stepwise portion 320A is enabled to be connected with an upper surface of the protruded portion 1021 only via the heat transfer sheet 42; thus, the heat transport capability may be enhanced. In the example illustrated in FIG. 6, the upper housing 101A may have a protruded portion 1012 facing the protruded portion 1021. In such a case, the upper housing 101A is preferably assembled with respect to the lower housing 102A so as to apply a downward load to the stepwise portion 320A, as indicated by a load F3 in FIG. 6.

Second Modification

Figure 7:
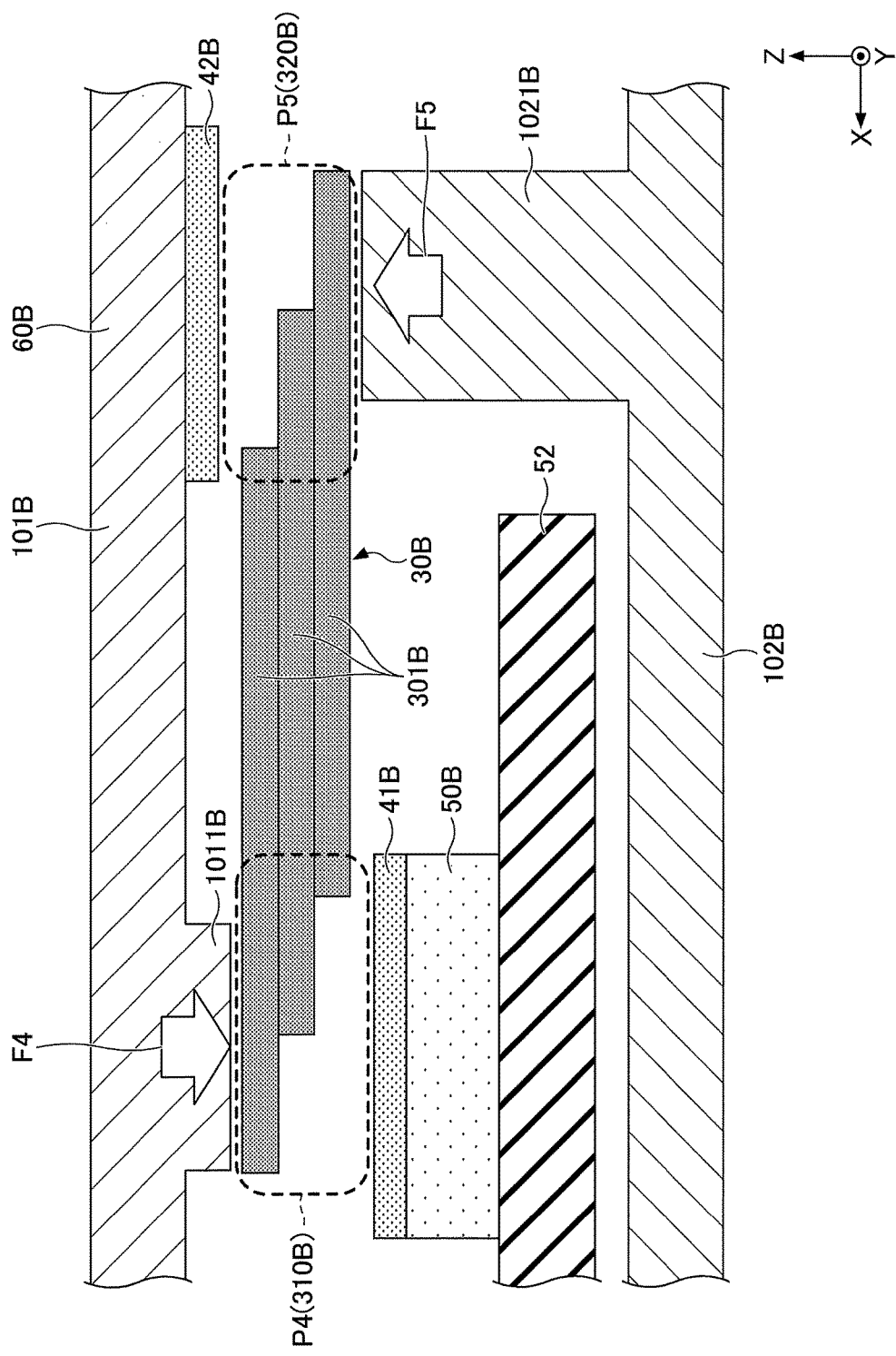
FIG. 7 is a view illustrating a second modification.

In a second modification, a heat source 50B and a heat radiation portion 60B are wider (longer in the X direction) than the heat source 50 and the heat radiation portion 60 of the first embodiment. In this case, as illustrated in FIG. 7, heat transfer sheets 41B and 42B may be widened similarly, and a protruded portion 1011B of an upper housing 101B and a protruded portion 1021B of a lower housing 102B may also be widened similarly. In this case, it is possible to widen respective offsets in the X direction of each of the layers 301B in the stepwise portion 310B (portion in P4) and in the stepwise portion 320B (portion in P5) of the graphite laminate 30B. This makes it possible to increase a contact area of the stepwise portion 310B that is connected with the heat source 50B via the heat transfer sheet 41B. Similarly, this also makes it possible to increase a contact area of the stepwise portion 320B that is connected with the heat radiation portion 60B via the heat transfer sheet 42B. Thus, it is possible to enhance the heat transport capability of the graphite laminate 30B in accordance with the heat source 50B and the heat radiation portion 60B having relatively large sizes. Likewise, as illustrated by loads F4 and F5 in FIG. 7, the protruded portion 1011B and the protruded portion 1021B preferably apply loads directed toward the heat source 50B and the heat radiation portion 60B, respectively, to the graphite laminate 30B. Thus, the heat transport capability between the heat source 50B and the heat radiation portion 60B via the graphite laminate 30B may further be enhanced.

Third Modification

Figure 8:
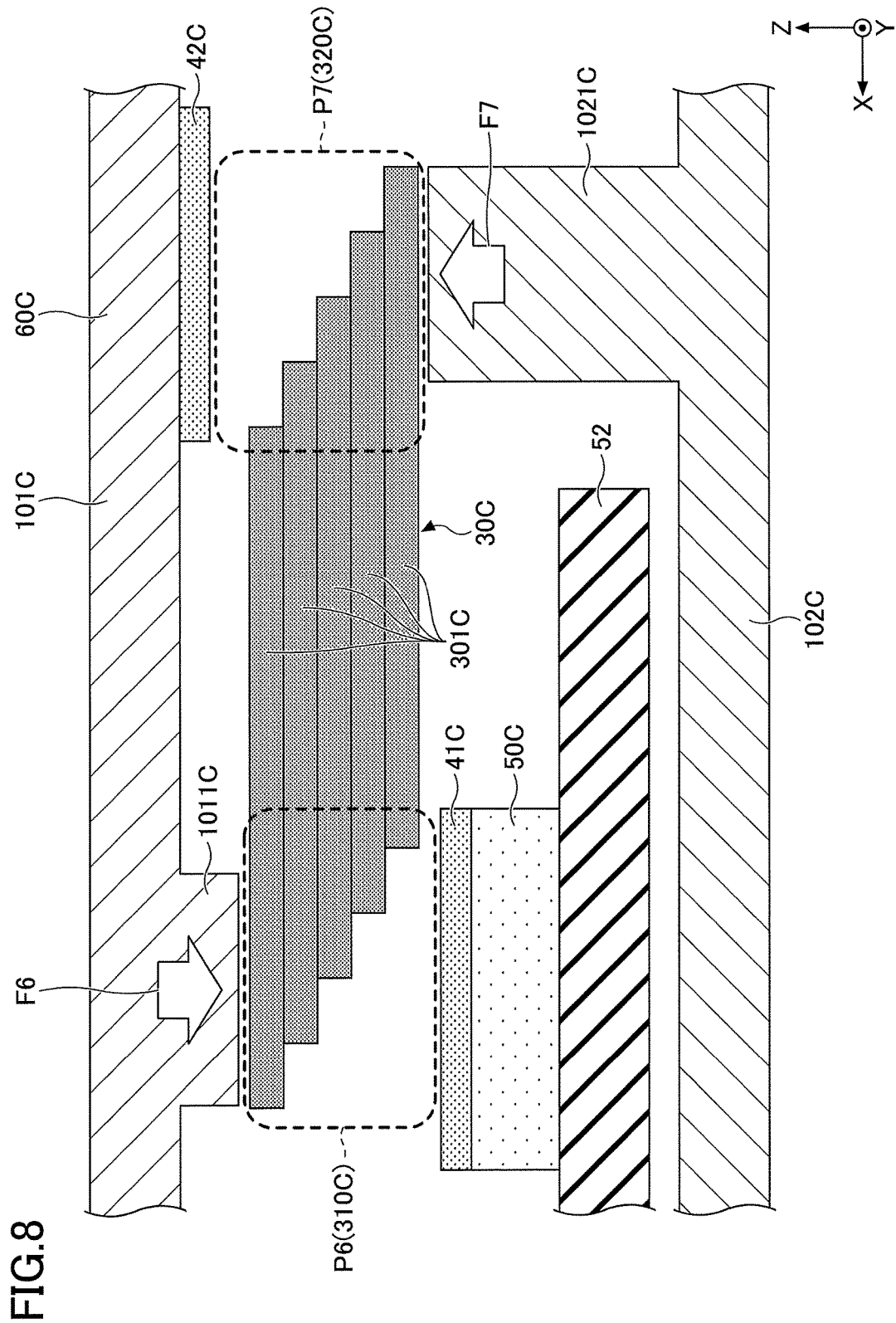
FIG. 8 is a view illustrating a third modification.

In a third modification, a heat source 50C and a heat radiation portion 60C are wider (longer in the X direction) than the heat source 50 and the heat radiation portion 60 of the first embodiment. In this case, as illustrated in FIG. 8, heat transfer sheets 41C and 42C may be widened similarly, and a protruded portion 1011C of an upper housing 101C and a protruded portion 1021C of a lower housing 102C may also be widened similarly. In this case, the number of layers may be increased as in an example of a graphite laminate 30C in FIG. 8. That is, in a stepwise portion 310C (portion in P6) and the stepwise portion 320C (portion in P7) of the graphite laminate 30C, the number of layers may be increased while maintaining an offset in the X direction of each layer 301C similar to that in the first embodiment. In FIG. 8, the number of layers is 5. As a result, the thickness of the graphite laminate 30C may be increased. Thus, according to the third modification, it is possible to enhance the heat transport capability of the graphite laminate 30C, in accordance with the heat source 50C and the heat radiation portion 60C having relatively large sizes. Likewise, as illustrated by loads F6 and F7 in FIG. 8, the protruded portion 1011C and the protruded portion 1021C preferably apply loads directed toward the heat source 50C and the heat radiation portion 60C, respectively, to the graphite laminate 30C. Thus, the heat transport capability between the heat source 50C and the heat radiation portion 60C via the graphite laminate 30C may further be enhanced.

Fourth Modification

Figure 9:
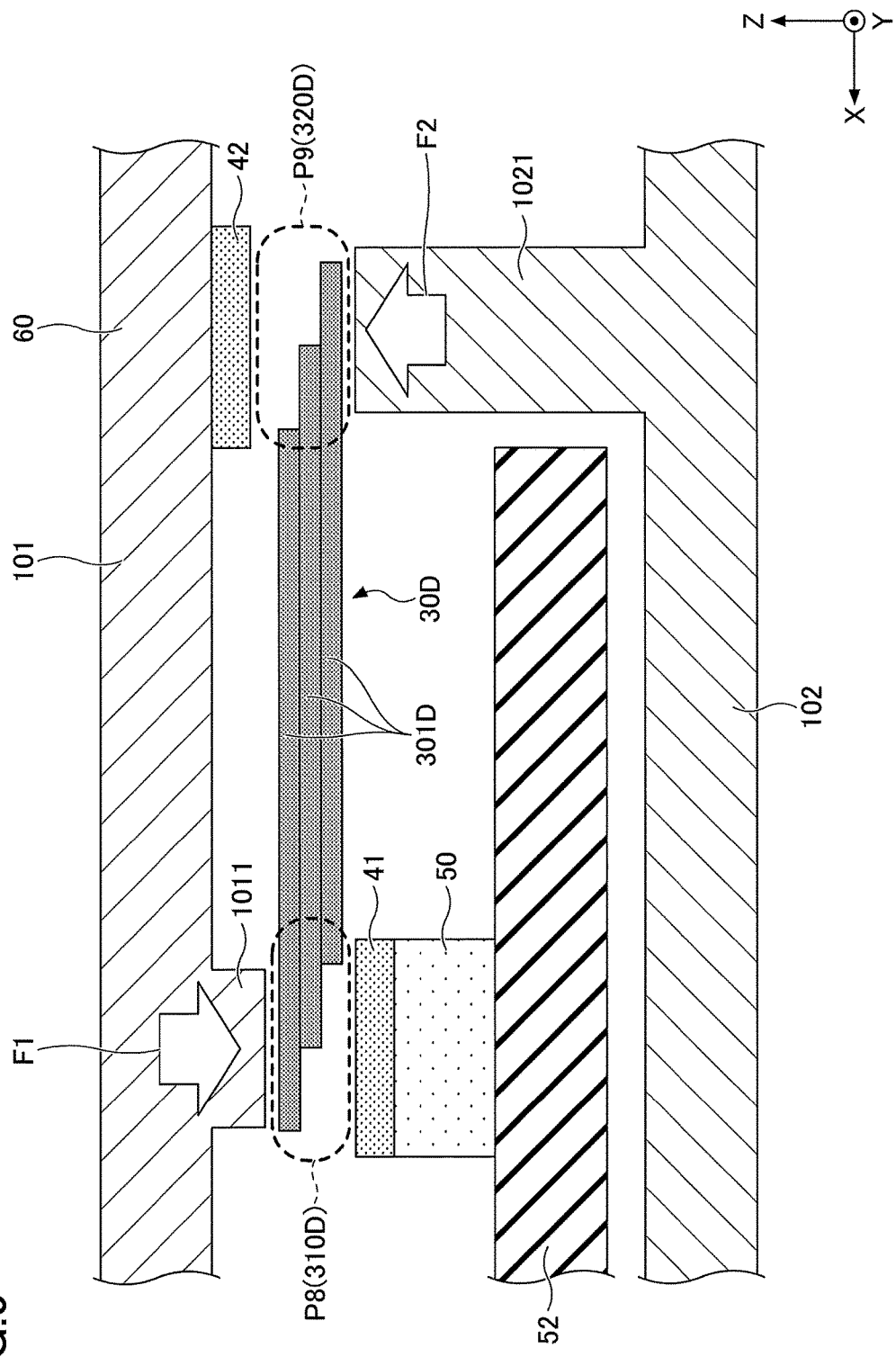
FIG. 9 is a view illustrating a fourth modification.

In a fourth modification, as illustrated in FIG. 9, each layer 301D of a graphite laminate 30D is thinner than each layer 301 of the above-described first embodiment. In this case, it is possible to increase respective offsets in the X direction of each layer 301D in the stepwise portion 310D (portion in P8) and in the stepwise portion 320D (portion in P9) of the graphite laminate 30D. Thus, it is possible to enhance the heat transport capability between the heat source 50 and the heat radiation portion 60 in accordance with the graphite laminate 30D using the relatively thin layers 301D.

Fifth Modification

Figure 10:
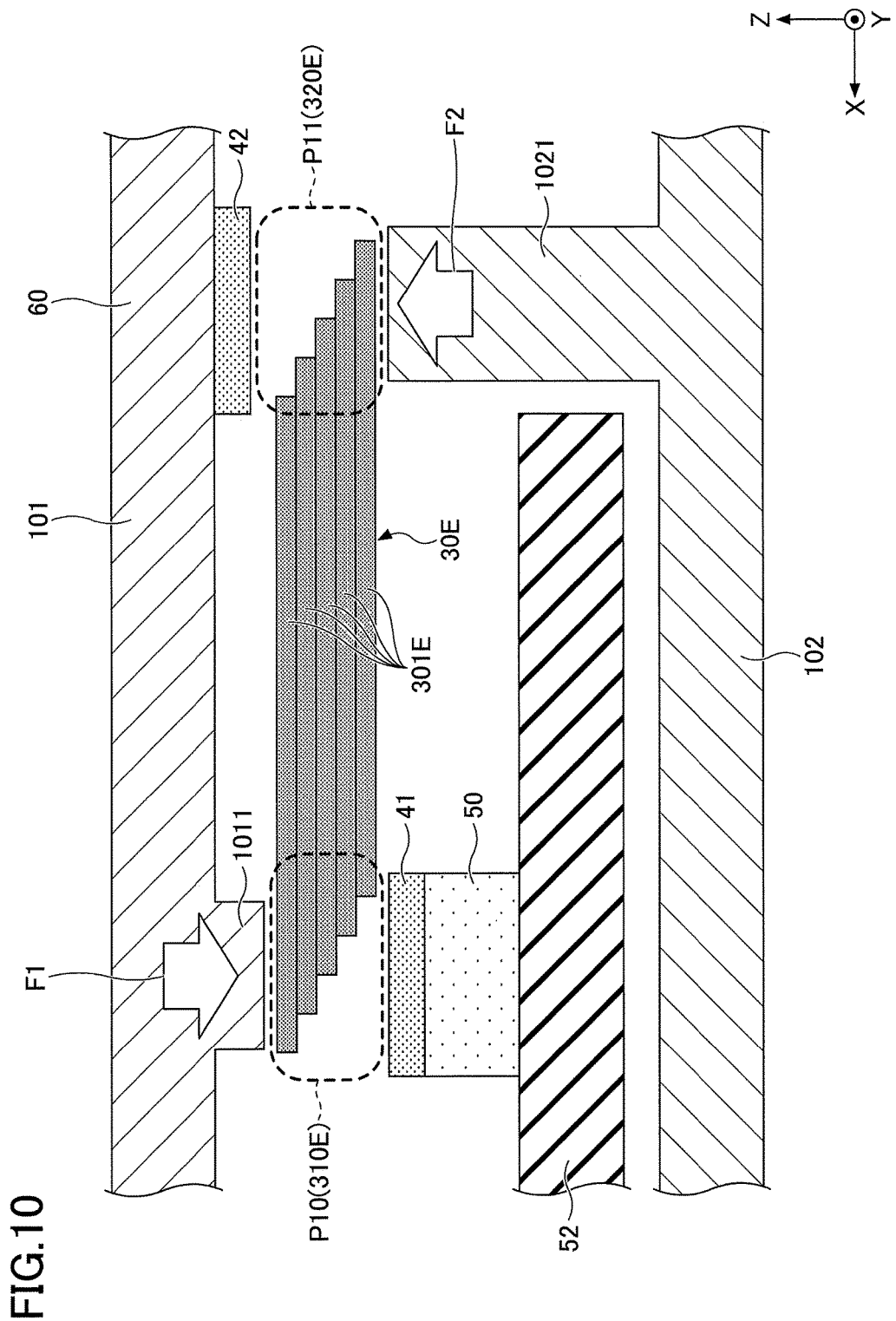
FIG. 10 is a view illustrating a fifth modification.

In a fifth modification, as illustrated in FIG. 10, each layer 301E of a graphite laminate 30E is thinner than each layer 301 of the above-described first embodiment. In this case, in a stepwise portion 310E (portion in P10) and the stepwise portion 320E (portion in P11) of the graphite laminate 30E, the number of layers is enabled to be increased while maintaining an offset in the X direction of each layer 301E similar to the offset in the X direction in the first embodiment. In FIG. 10, the number of layers is 5. Thus, it is possible to enhance the heat transport capability between the heat source 50 and the heat radiation portion 60 in accordance with the graphite laminate 30E using a relatively large number of the relatively thin layers 301E.

As may be understood from the above-described second modification to fifth modification, the number of layers and the amount of offset (amount of offset of each layer) of the graphite laminate may be optimized according to size of the heat source and the heat radiating portion (an area where the graphite laminate is allowed to be connected with).

Sixth Modification

Figure 11:
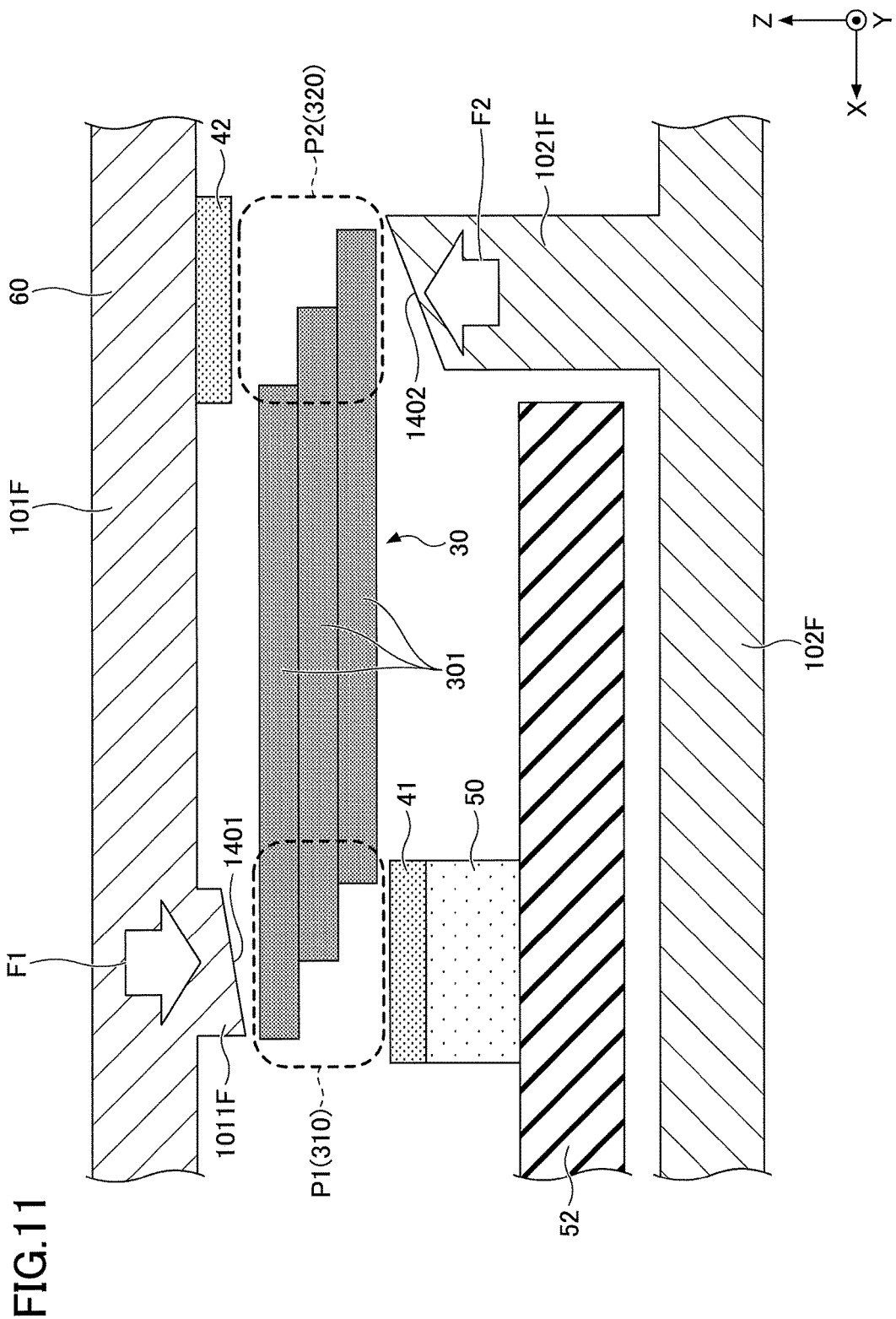
FIG. 11 is a view illustrating a sixth modification.

In a sixth modification, as illustrated in FIG. 11, a protruded portion 1011F of an upper housing 101F has an inclined surface 1401 (an example of a first inclined surface) that approaches the heat source 50 in the Z direction as the protruded portion 1011F approaches an edge of the stepwise portion 310 in the X direction. Note that in a further modification, the inclined surface 1401 may be a stepped surface (an example of a first stepped surface) such that the inclined surface 1401 approaches the heat source 50 in the Z direction as the inclined surface 1401 approaches the edge of the stepwise portion 310 in the X direction.

In the sixth modification, a protruded portion 1021F of a lower housing 102F has an inclined surface 1402 (an example of a second inclined surface) that approaches the heat radiation portion 60 in the Z direction as the protruded portion 1021F approaches an edge of the stepwise portion 320 in the X direction. Note that in a further modification, the inclined surface 1402 may be a stepped surface (an example of a second stepped surface) that approaches the heat radiation portion 60 in the Z direction as the inclined surface 1402 approaches the edge of the stepwise portion 320 in the X direction.

Figure 12:
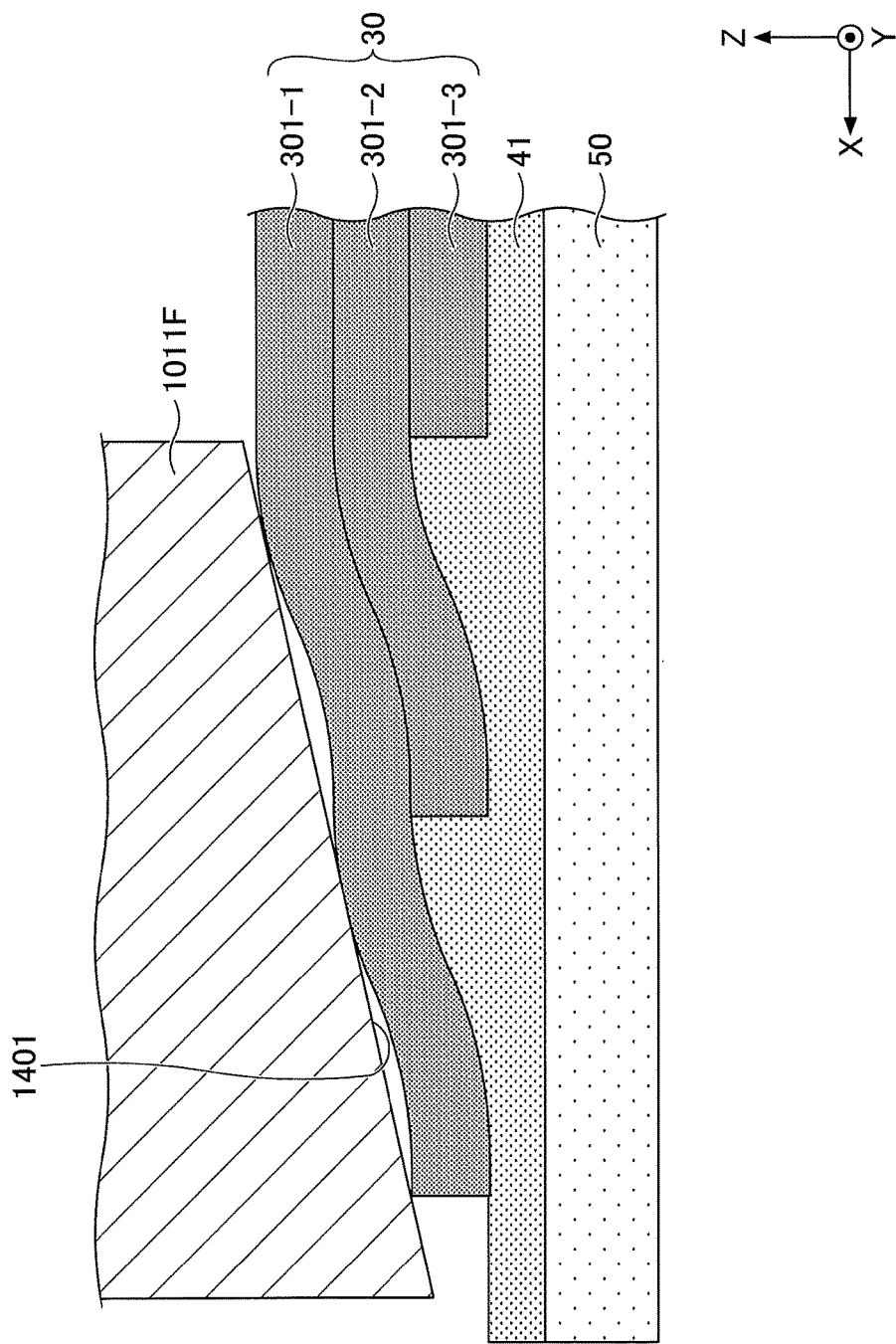
FIG. 12 is a view illustrating an effect of the sixth modification.

FIG. 12 is a view illustrating an effect of the inclined surface 1401, which is a cross-sectional view schematically illustrating a state of the stepwise portion 310 and the heat transfer sheet 41 between the heat source 50 and the upper housing 101F. In FIG. 12, the inclined surface 1401 is illustrated; however, the same description is also applied to an inclined surface 1402.

In the stepwise portion 310, as described above, an edge of the lower layer 301-3 and an edge of the intermediate layer 301-2 are offset from each other, and an edge of the intermediate layer 301-2 and an edge of the upper layer 301-1 are offset from each other. Accordingly, as illustrated in FIG. 12, the intermediate layer 301-2 may be connected with in the Z direction via the heat transfer sheet 41 outside the edge of the lower layer 301-3. In addition, the upper layer 301-1 may also be connected with in the Z direction via the heat transfer sheet 41 outside the edge of the intermediate layer 301-2.

Further, as may be understood by comparing FIG. 12 with FIG. 4, since the protruded portion 1011F is enabled to be connected with the upper layer 301-1 via the inclined surface 1401, the protruded portion 1011F is enabled to directly press the upper layer 301-1 against the heat transfer sheet 41. Similarly, since the protruded portion 1011F is enabled to be connected with the intermediate layer 301-2 via the inclined surface 1401, the protruded portion 1011F is enabled to directly press the upper layer 301-1 against the heat transfer sheet 41. Thus, it is possible to stabilize the contact between the stepwise portion 310 and the heat source 50 via the heat transfer sheet 41.

The sixth modification is suitable for cases where the number of layers is relatively large or where the thickness of one layer is relatively large. This is because as the number of layers is relatively large, a gap in the Z direction between an upper layer and the heat transfer sheet 41 tends to become large. Similarly, as the thickness of one layer becomes relatively large, a gap in the Z direction between an upper layer and the heat transfer sheet 41 tends to become large.

Note that such inclined surfaces 1401 and 1402 may also be applied to the first modification to fifth modification described above. In the sixth modification, the inclined surfaces 1401 and 1402 are disposed; however, only one of the inclined surfaces 1401 and 1402 may be omitted.

In the sixth modification described above, the inclined surface 1402 is formed on the protruded portion 1021F; however, an inclined surface inclined along a same direction of the inclined surface 1402, may be formed on the upper housing 101F immediately beneath the heat radiation portion 60. In this case, the inclined surface 1402 may be omitted.

Seventh Modification

Figure 13:
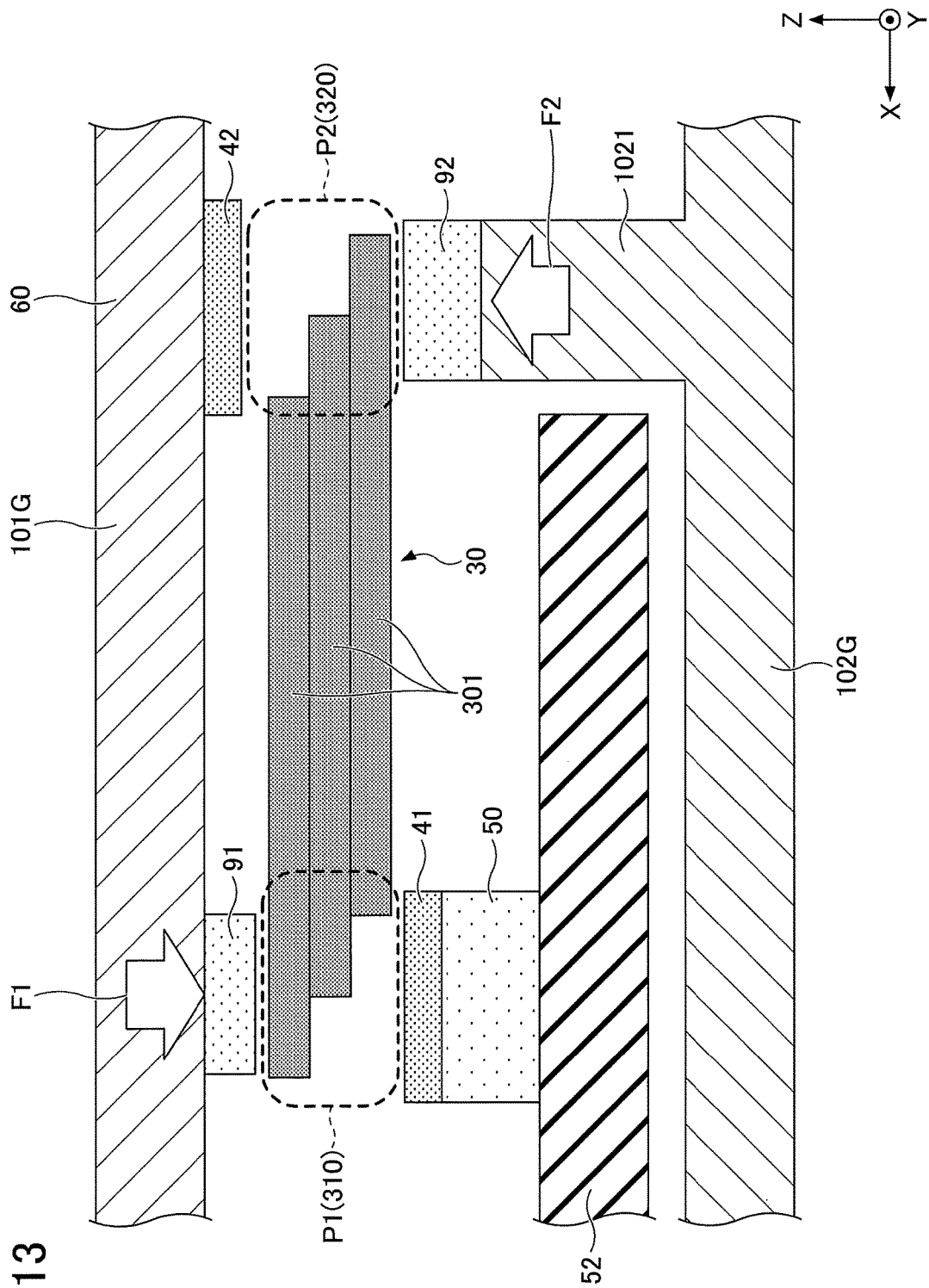
FIG. 13 is a view illustrating a seventh modification.

In a seventh modification, as illustrated in FIG. 13, a cushion material 91 (an example of a first elastic member) is disposed between the stepwise portion 310 and the upper housing 101G in the Z direction. The cushion material 91 may be fixed to an upper housing 101G or the graphite laminate 30 with an adhesive, a double-sided tape, or the like. In addition, a cushion material 92 (an example of a second elastic member) is disposed between the stepwise portion 320 and the lower housing 102G in the Z direction. The cushion material 92 may be fixed to a lower housing 102G or the graphite laminate 30 with an adhesive, a double-sided tape, or the like. The cushion materials 91 and 92 may be made of, for example, rubber, urethane, or the like.

Figure 14:
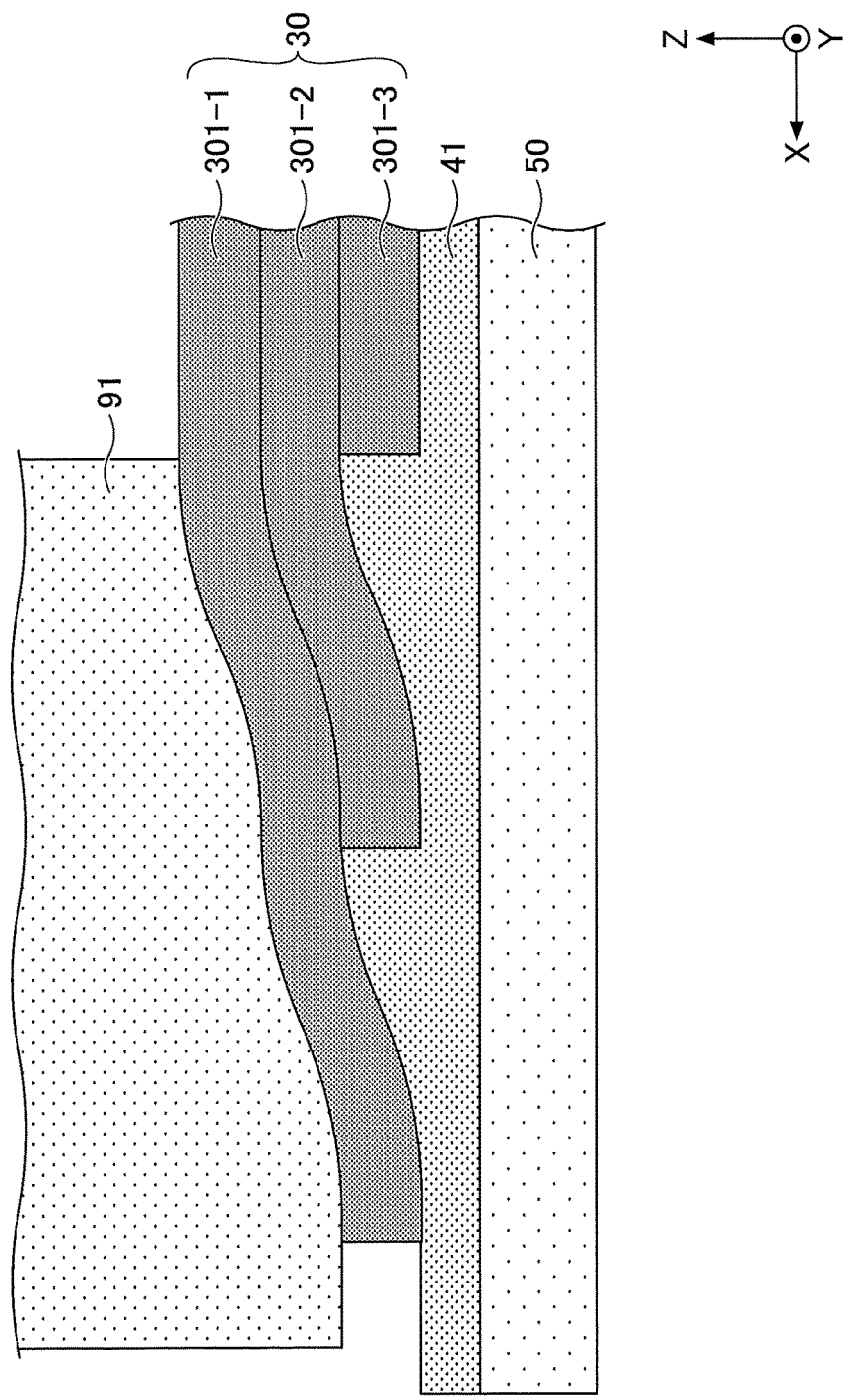
FIG. 14 is a view illustrating an effect of the seventh modification.

FIG. 14 is a view illustrating an effect of the cushion material 91, which is a cross-sectional view schematically illustrating a state of the stepwise portion 310 and the heat transfer sheet 41 between the heat source 50 and the upper housing 101G. In FIG. 14, the cushion material 91 is illustrated; however, the same description is also applied to the cushion material 92.

In the stepwise portion 310, as described above, an edge of the lower layer 301-3 and an edge of the intermediate layer 301-2 are offset from each other, and an edge of the intermediate layer 301-2 and an edge of the upper layer 301-1 are offset from each other. Accordingly, as illustrated in FIG. 14, the intermediate layer 301-2 is enabled to be connected with the heat source 50 in the Z direction via the heat transfer sheet 41 outside the edge of the lower layer 301-3. In addition, the upper layer 301-1 is also enabled to be connected with the heat source 50 in the Z direction via the heat transfer sheet 41 outside the edge of the intermediate layer 301-2.

Further, as may be understood by comparing FIG. 14 with FIG. 4, since the cushion material 91 is elastically deformed to be connected with the upper layer 301-1, the upper housing 101G is enabled to press the upper layer 301-1 against the heat transfer sheet 41 via the cushion material 91. Likewise, since the cushion material 91 is elastically deformed to be connected with the intermediate layer 301-2, the upper housing 101G is enabled to press the upper layer 301-1 against the heat transfer sheet 41 via the cushion material 91. In this case, the elastic deformation of the cushion material 91 is enabled to evenly apply loads to the respective layers 301. Thus, it is possible to stabilize the contact between the stepwise portion 310 and the heat source 50 via the heat transfer sheet 41.

The seventh modification is suitable for cases where the number of layers is relatively large or where the thickness of one layer is relatively large.

Note that such cushion materials 91 and 92 may also be applied to the first modification to fifth modification described above. In the seventh modification, the cushion materials 91 and 92 are disposed; however, only one of the cushion materials 91 and 92 may be omitted.

Eighth Modification

Figure 15:
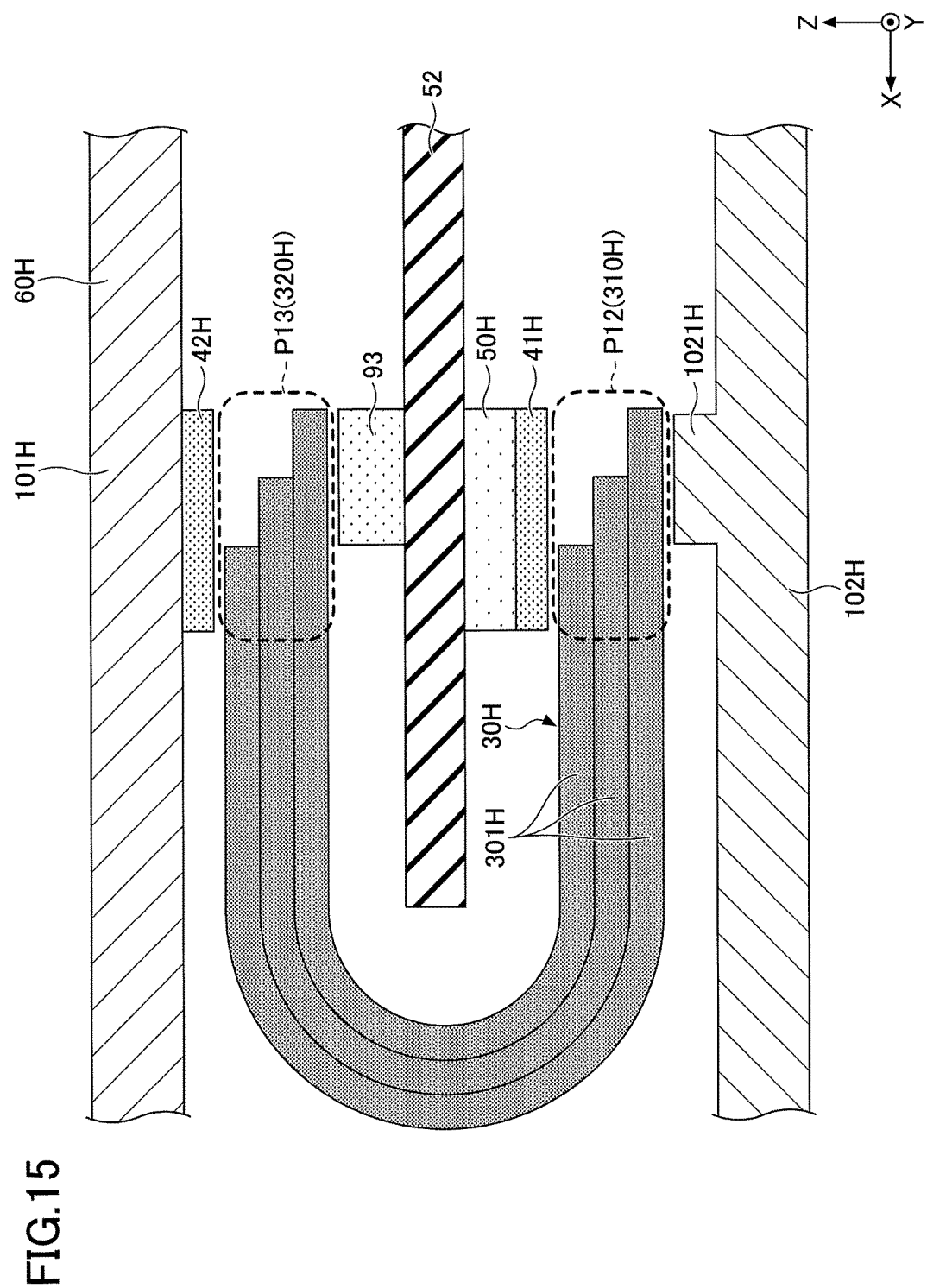
FIG. 15 is a view illustrating an eighth modification.

In the eighth modification, as illustrated in FIG. 15, a heat source 50H is disposed on a lower surface of the substrate 52. Further, a graphite laminate 30H is formed in a U shape in a cross-sectional view to sandwich the substrate 52 in the Z direction. Such a configuration is advantageous, for example, when there is a structural restriction such as there being limited space for disposing a heat source on the upper side of the substrate 52. In this case, as illustrated in FIG. 15, the stepwise portion 310H (portion in P12) of the graphite laminate 30H is positioned below the substrate 52, where the plurality of layers 301H form an upward stepwise form. In addition, the stepwise portion 320H (portion in P13) is positioned above the substrate 52, where the plurality of layers 301H form an upward stepwise form.

In this case, each of the layers 301H of the stepwise portion 310H is enabled to be connected with the heat source 50H only via the heat transfer sheet 41H. Further, each of the layers 301H of the stepwise portion 320H is enabled to be connected with the heat radiation portion 60H only via the heat transfer sheet 42H. Hence, according to the eighth modification, it is possible to enhance the heat transport capability between the heat source 50H and the heat radiation portion 60H in accordance with the graphite laminate 30H.

In addition, in the eighth modification, since the lower housing 102H has the protruded portion 1021H, the protruded portion 1021H applies a load directed toward the heat source 50H to the graphite laminate 30H.

Further, in the eighth modification, a cushion material 93 is disposed between the substrate 52 and the stepwise portion 320H in the Z direction. The cushion material 93 has the same functions as the cushion materials 91 and 92 according to the seventh modification described above. That is, the cushion material 93 may be enabled to evenly press the stepwise portion 320H against the heat radiation portion 60H via the heat transfer sheet 42H. Thus, it is possible to stabilize the contact between the stepwise portion 320H and the heat radiation portion 60H via the heat transfer sheet 42H.

In the eighth modification, a cushioning material may be disposed in place of or in addition to the protruded portion 1021H. Further, as in the sixth modification described above, the upper surface of the protruded portion 1021H may be an inclined surface.

Ninth Modification

Figure 16:
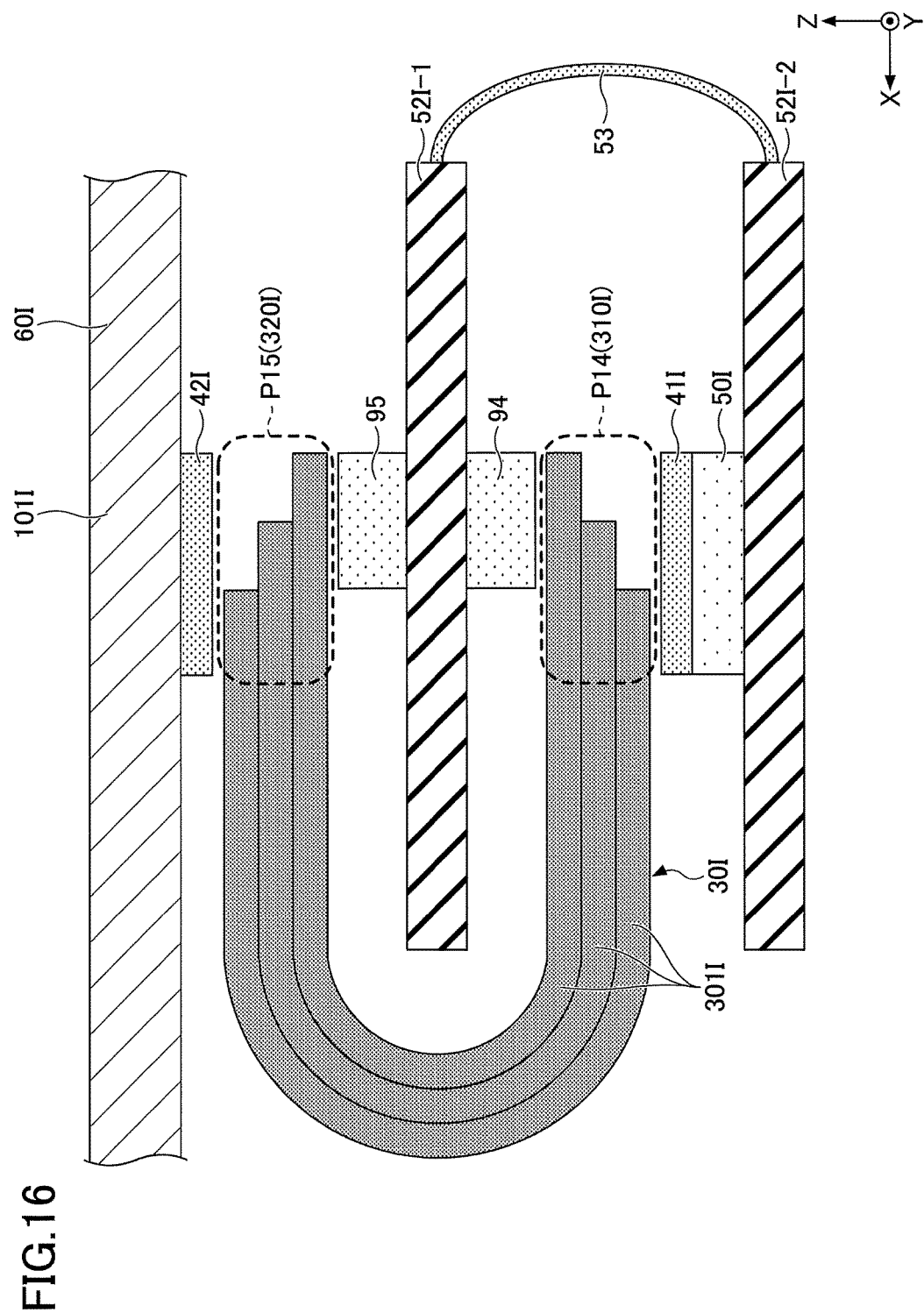
FIG. 16 is a view illustrating a ninth modification.

In a ninth modification, as illustrated in FIG. 16, a sub board 52I-1 is separated from a main board 52I-2, and is electrically connected to the main board 52I-2 via a flexible board 53. The heat source 50I is installed on the main board 52I-2. Such a configuration is advantageous in effectively utilizing the installation space. Note that the flexible board 53 may be inner layers of the sub board 52I-1 and the main board 52I-2 drawn to the outside.

A graphite laminate 30I is formed in a U-shape in a cross-sectional view to sandwich the sub board 52I-1 in the Z direction. In this case, as illustrated in FIG. 16, a stepwise portion 310I (portion in P1) of a graphite laminate 30I has a plurality of layers 301I forming a downward stepwise form. In addition, a stepwise portion 320I (the portion in P15) of the graphite laminate 30I has the plurality of layers 301I forming an upward stepwise form.

In this case, each of the layers 301I of the stepwise portion 310I is also enabled to be connected with the heat source 50I only via the heat transfer sheet 41I. Further, each of the layers 301I of the stepwise portion 320I is enabled to be connected with the heat radiation portion 60I only via the heat transfer sheet 42I. Hence, according to the ninth modification, it is also possible to enhance the heat transport capability between the heat source 50I and the heat radiation portion 60I in accordance with the graphite laminate 30I.

In the ninth modification, a cushion material 94 is disposed between the sub board 52I-1 and the stepwise portion 310I in the Z direction, and a cushion material 95 is disposed between the sub board 52I-1 and the stepwise portion 320I in the Z direction. The cushion materials 94 and 95 have the same functions as the cushion materials 91 and 92 according to the seventh modification described above. That is, the cushion material 94 is enabled to evenly press respective layers 301I of the stepwise portion 310I against the heat source 50I via the heat transfer sheet 41I. Thus, it is possible to stabilize the contact between the stepwise portion 310I and the heat source 50I via the heat transfer sheet 41I. In addition, the cushion material 95 is enabled to evenly press the respective layers 301I of the stepwise portion 320I against the heat radiation portion 60I via the heat transfer sheet 42I. Thus, it is possible to stabilize the contact between the stepwise portion 320I and the heat radiation portion 60I via the heat transfer sheet 42I.

Tenth Modification

Figure 17:
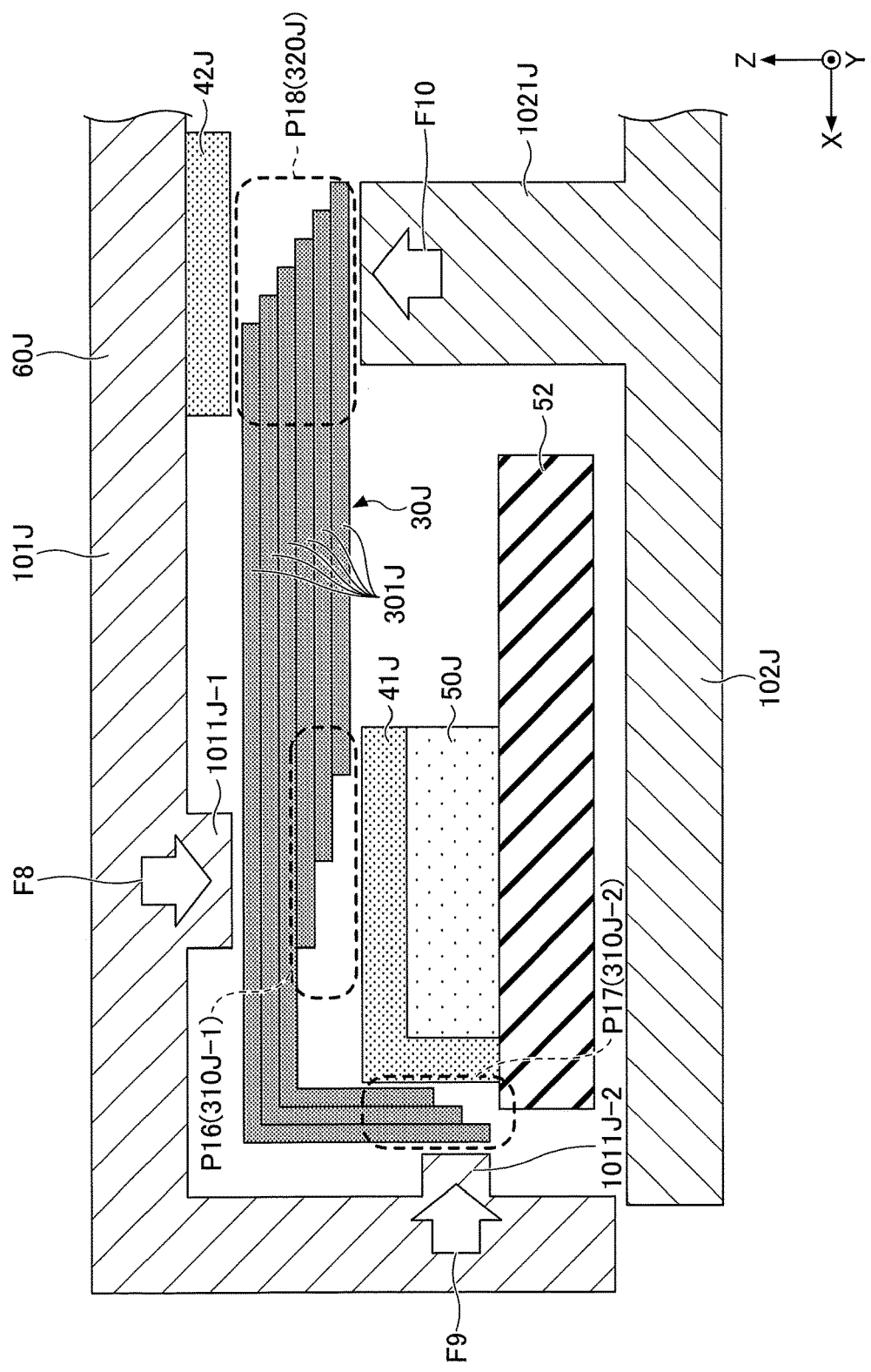
FIG. 17 is a view illustrating a tenth modification.

FIG. 17 is a view illustrating a tenth modification, which schematically illustrates a cross-sectional view of a state before an upper housing 101J being assembled (the upper housing 101J is in a state slightly away from the lower housing 102J in the Z direction and the X direction).

A graphite laminate 30J has two stepwise portions 310J-1 and 310J-2 (portions in P16 and P17) with respect to a heat source 50J. In this case, as illustrated in FIG. 17, the stepwise portion 310J-1 of the graphite laminate 30J has a plurality of layers 301J (lower three layers out of six layers) forming a downward stepwise form. The stepwise portion 310J-2 has a plurality of layers 301J (upper three layers out of six layers) forming an inward stepwise form in the X direction (a stepwise form directed inward toward the heat source 50J). In addition, the stepwise portion 320J has a plurality of layers 301J (all six layers) forming an upward stepwise form.

In this case, each of the plurality of layers 301J (lower three layers out of the six layers) of the stepwise portion 310J-1 is enabled to be connected with an upper surface of the heat source 50J only via the heat transfer sheet 41J. Further, each of the plurality of layers 301J (upper three layers out of the six layers) of the stepwise portion 310J-2 is enabled to be connected with a side surface of the heat source 50J only via the heat transfer sheet 41J. Further, each of the layers 301J (all six layers) of the stepwise portion 320J is enabled to be connected with the heat radiation portion 60J only via the heat transfer sheet 42J. Hence, according to the tenth modification, it is possible to enhance the heat transport capability between the heat source 50J and the heat radiation portion 60J in accordance with the graphite laminate 30J.

Similarly, a combination of the protruded portions 1011J-1 and 1011J-2 of the upper housing 101J and the protruded portion 1021J of the lower housing 102 preferably apply loads directed toward the heat source 50J and the heat radiation portion 60J, respectively, to the graphite laminate 30J (see loads F8, F9 and F10 in FIG. 17). Accordingly, it is possible to further enhance the heat transport capability between the heat source 50J and the heat radiation portion 60J in accordance with the graphite laminate 30J.

In the tenth modification, the protruded portions 1011J-1, 1011J-2, and the protruded portion 1021J may each be provided with an inclined surface such as the inclined surface 1401 as in the above-described sixth modification, or may each be provided with a cushion material as in the above-described seventh modification.

Eleventh Modification

Figure 18:
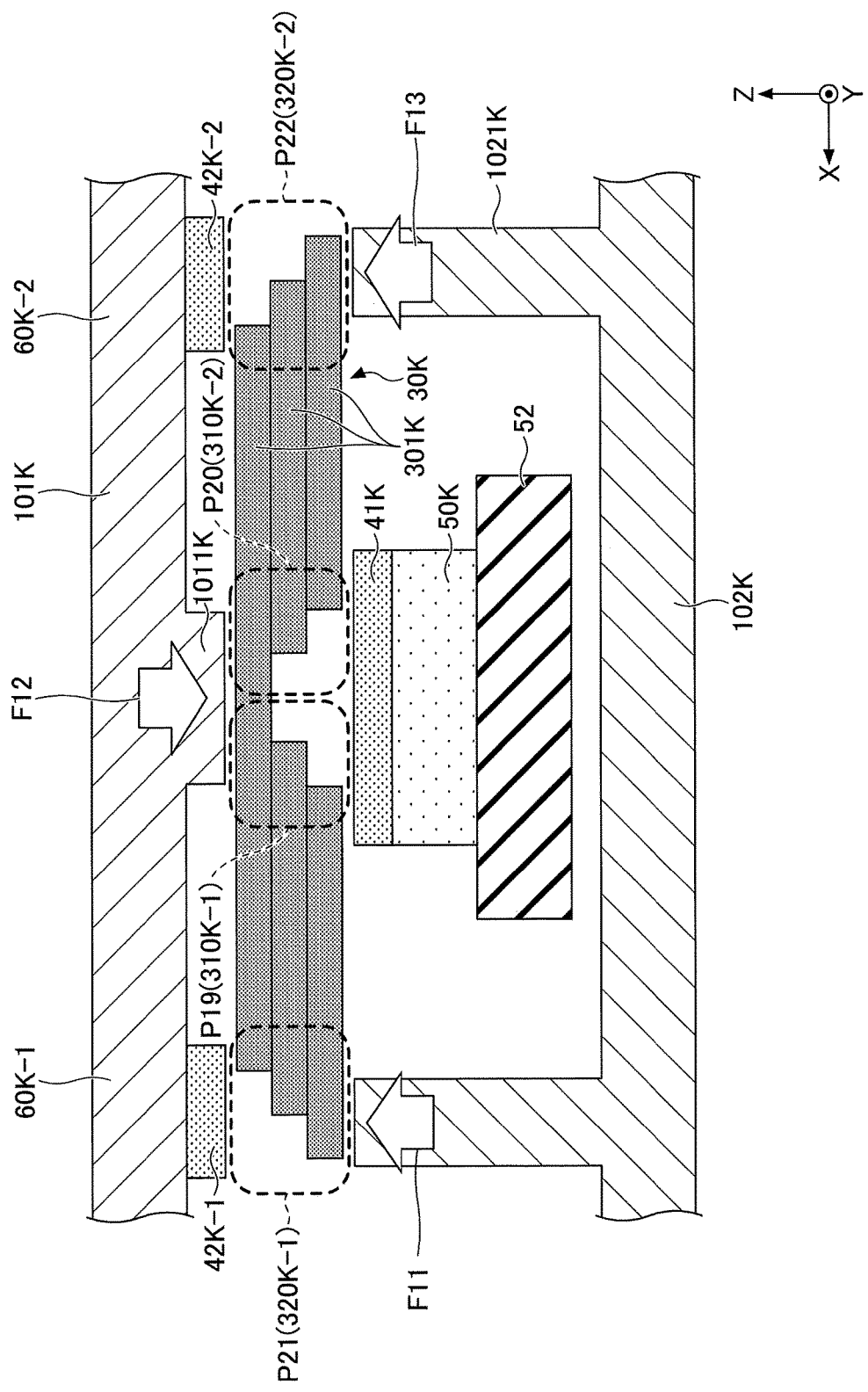
FIG. 18 is a view illustrating an eleventh modification.

FIG. 18 is a view illustrating an eleventh modification, which schematically illustrates a cross-sectional view of a state before an upper housing 101K being assembled (the upper housing 101K being in a state slightly away from the lower housing 102K in the Z direction).

A graphite laminate 30K has two stepwise portions 310K-1 and 310K-2 (portions in P19 and P20) with respect to a heat source 50K. In this case, as illustrated in FIG. 18, the stepwise portion 310K-1 of the graphite laminate 30K is formed with respect to a half of the heat source 50K in the X direction, and the stepwise portion 310K-2 is formed with respect to the other half of the heat source 50K in the X direction. The stepwise portion 310K-1 and the stepwise portion 310K-2 each have a plurality of layers 301K formed in a downward stepwise form. The stepwise portion 310K-1 and the stepwise portion 310K-2 may be implemented by forming openings (offset openings) of different sizes in the lower layer and the intermediate layer of the layers 301K. Alternatively, the stepwise portion 310K-1 and the stepwise portion 310K-2 are implemented by forming the lower layer and the intermediate layer of the layers 301K as different graphite sheets (graphite sheets separate from each other in the X direction).

In the eleventh modification, two heat radiation portions 60K-1 and 60K-2 are formed on the upper housing 101K. Along the formation of the heat radiation portions 60K-1 and 60K-2, as illustrated in FIG. 18, the stepwise portion 320K-1 of the graphite laminate 30K is formed with respect to the heat radiation portion 60K-1, and the stepwise portion 320K-2 is formed with respect to the heat radiation portion 60K-2. The stepwise portion 320K-1 and the stepwise portion 320K-2 each have a plurality of layers 301K forming an upward stepwise form.

In this case, each of the layers 301K of the stepwise portion 310K-1 and the stepwise portion 310K-2 is enabled to be connected with the heat source 50K only via the heat transfer sheet 41K. Further, each of the layers 301K of the stepwise portion 320K-1 and the stepwise portion 320K-2 is enabled to be connected with the heat radiation portion 60K only via the heat transfer sheet 42K. Hence, according to the eleventh modification, it is also possible to enhance the heat transport capability between the heat source 50K and the heat radiation portion 60K in accordance with the graphite laminate 30K. Specifically, in the eleventh modification, a total number of two lines of heat transport paths (heat radiation paths) for transporting heat to the respective two sides in the X direction centering on the heat source 50K are formed. In a further modification, three or more lines of heat transport paths may be implemented with respect to one heat source.

Second Embodiment

Figure 19:
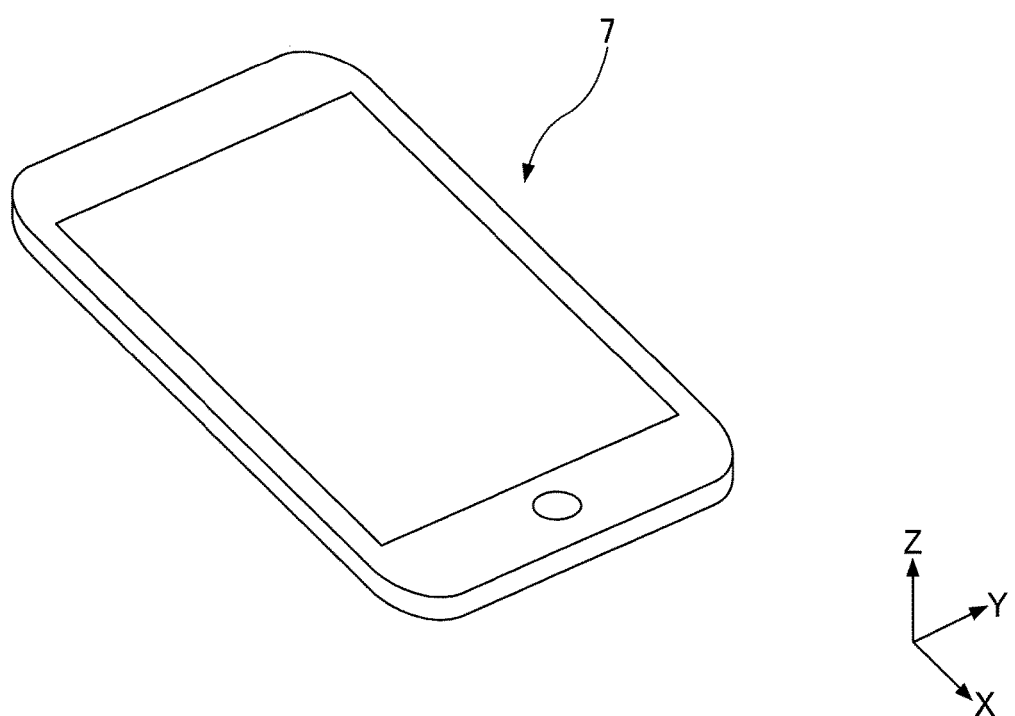
FIG. 19 is a schematic diagram illustrating an appearance of another example (smartphone) of an electronic device.

A second embodiment relates to an example being applied to a smartphone 100 (another example of an electronic device) as illustrated in FIG. 19, in place of the optical transceiver 1. Note that the second embodiment may be applied to a portable information terminal such as a mobile phone, a PDA (personal digital assistant), a tablet, a portable game machine, a portable music player, or the like, in place of the smartphone 6.

Figure 20:
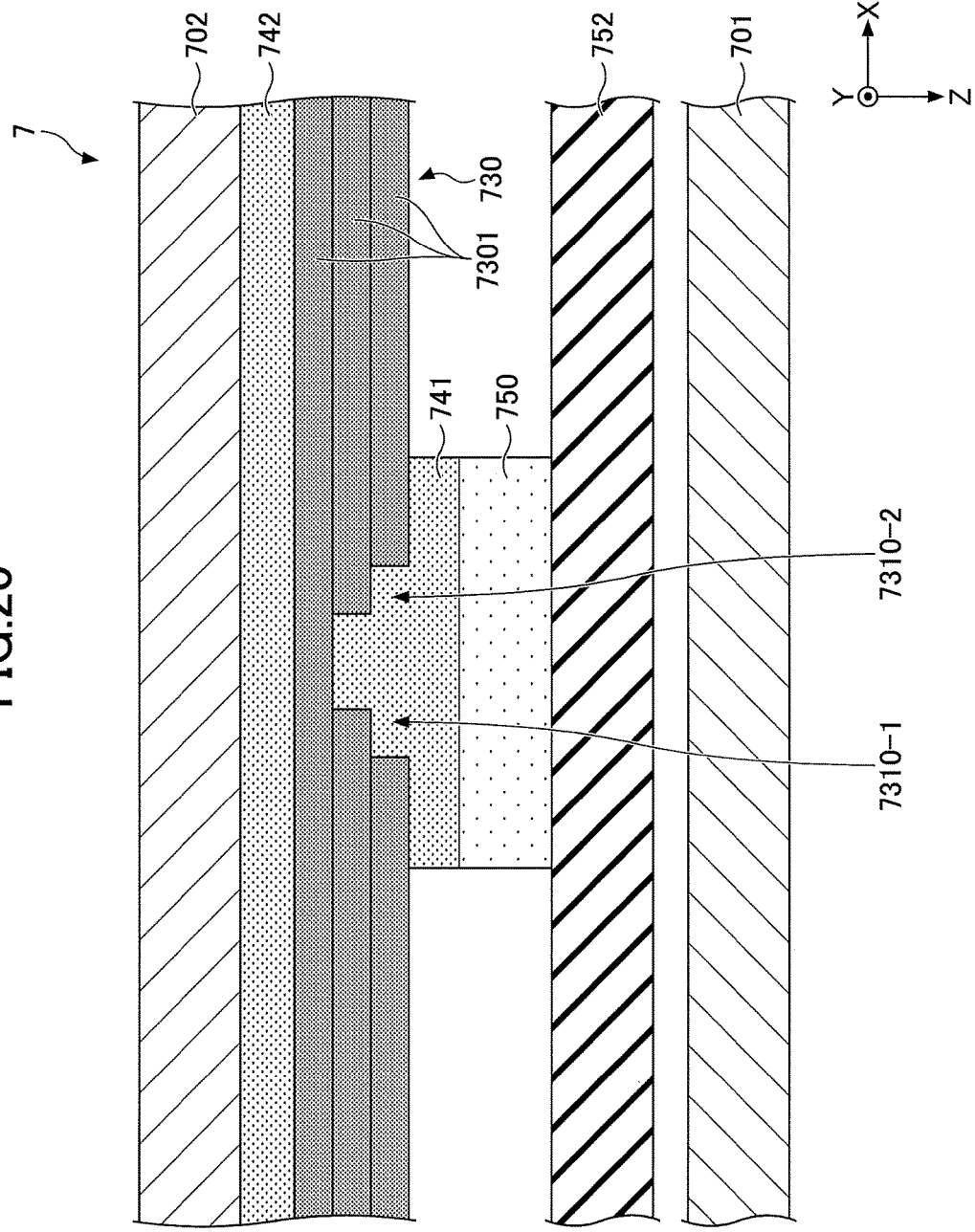
FIG. 20 is a schematic cross-sectional view of a smartphone.

FIG. 20 is a schematic cross-sectional view of a smartphone 6. In FIG. 20, a cross section passing through a heat generating component 750 (an example of a heat source) is illustrated. The heat generating component 750 may be, for example, an IC package such as an LSI, or may be an element itself. The heat generating component 750 is installed on a substrate 752.

In the second embodiment, in the smartphone 6, an entire housing rear portion 702 forms a heat radiation portion, for an example. However, in a modification of the second embodiment, a part of the housing rear portion 702 may form a heat radiation portion. The housing rear portion 702 is made of a material having relatively high thermal conductivity such as aluminum or the like.

The smartphone 6 includes a graphite laminate 730. The graphite laminate 730 is formed by laminating respective layers 7301 containing graphite in the Z direction. In the second embodiment, the graphite laminate 730 includes three layers 7301 as illustrated in FIG. 20, for example. The layers 7301 are each made of, for example, sheet-like graphite (graphite sheet).

The graphite laminate 730 has the plurality of layers 7301, the edges of which are offset from each other to form stepwise forms corresponding to the stepwise portions 7310-1 and 7310-2 (edges above the center area of the heat generating component 750 in the X direction in the case of FIG. 20). In this case, as illustrated in FIG. 20, the stepwise portion 7310-1 of the graphite laminate 730 is formed with respect to a half of the heat generating component 750 in the X direction, and the stepwise portion 7310-2 is formed with respect to the other half of the heat generating component 750 in the X direction. The stepwise portion 7310K-1 and the stepwise portion 7310K-2 each have a plurality of layers 7301K forming a downward stepwise form. The stepwise portion 7310-1 and the stepwise portion 7310-2 may be implemented by forming openings (offset openings) of different sizes in the lower layer and the intermediate layer of the layers 7301. Alternatively, the stepwise portion 7310-1 and the stepwise portion 7310-2 are implemented by forming the lower layer and the intermediate layer of the layers 7301 as different graphite sheets (graphite sheets separate from each other in the X direction). Note that a heat transfer sheet 742 (e.g., TIM) is disposed on the rear side of the graphite laminate 730. Accordingly, heat from the heat generating component 750 is transferred to the housing rear portion 702 through the graphite laminate 730 and the heat transfer sheet 742.

According to the second embodiment, each of the layers 7301 of the stepwise portions 7310-1 and 7310-2 are enabled to be connected with the heat generating component 750 only through the heat transfer sheet 741. As a result, heat may be efficiently transferred from the heat generating component 750 through the graphite laminate 730 to the housing rear portion 702.

In the second embodiment, the housing rear portion 702 forms a heat radiation portion; however, the housing front portion 701 may form a heat radiation portion. In this case, the cross-sectional structure in FIG. 20 is a structure in which the housing rear portion 702 and the housing front portion 701 are switched. However, when the housing front portion 701 is a glass plate or the like, it is more advantageous to use the housing rear portion 702 as a heat radiation portion.

The embodiments of the present invention have been described in detail above; however, the present invention is not limited to a specific one of the embodiments, and various modifications and changes may be made within the scope described in the claims. In addition, it is also possible to combine part or all of the above-described embodiments.

For example, in the above-described first embodiment, the optical transceiver 1 is an electronic device; however, other types of electronic devices may also be used. For example, the above-described first embodiment may be applied to an electronic device such as a relatively large-sized electronic device such as a server, or an in-vehicle device (e.g., inverter device for driving a motor) installed in a moving body.

Further, in the above-described first embodiment (the same applies to other modifications), the protruded portion

1011 and the protruded portion 1021 are each formed of a housing; however, the present invention is not limited thereto. The protruded portion 1011 and the protruded portion 1021 may each be formed of members within the housing. For example, the protruded portion 1011 may be formed of a member disposed on the graphite laminate 30.

Further, in the above-described first embodiment (the same applies to other modifications and the second embodiment), the graphite laminate 30 may have a high heat transport capability as described above without inclusion of a special member (e.g., the heat transfer member conducting heat through the graphite laminate 30 in the Z direction). However, the present invention does not exclude the presence of such a special member.

Further, in the above-described first embodiment (the same applies to other modifications and the second embodiment), in the graphite laminate 30, all the edges of the layers 301 are offset from each other to form a stepwise form; however, only the edges of some of the plurality of layers may be offset from each other to form a stepwise form.

In addition, in the above-described first embodiment (the same applies to other modifications), the stepwise portion 310 is formed with respect to the heat source 50 and the stepwise portion 320 is formed with respect to the heat radiation portion 60; however, only one of the stepwise portion 310 and the stepwise portion 320 may be formed. For example, even if only the stepwise portion 310 is formed with respect to the heat source 50, it is possible to increase the heat transport capability compared with the comparative example (see FIG. 5) described above.

According to at least one aspect of the present invention, a heat transport capability of a graphite laminate may be enhanced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a graphite laminate having a plurality of layers laminated in a first direction, each layer containing graphite;
    a housing forming a heat radiation portion and configured to house the graphite laminate; and
    a heat source disposed within the housing,
    wherein the graphite laminate comprises:
    a first portion in a stepwise form in which first edges of the plurality of layers toward a second direction orthogonal to the first direction are offset from each other, the first portion being thermally connected to the heat source; and
    a second portion in a stepwise form in which second edges of the plurality of layers toward a third direction orthogonal to both the first direction and the second direction are offset from each other, the second portion being thermally connected to the heat radiation portion.

2. An electronic device comprising:
    a graphite laminate having a plurality of layers laminated in a first direction, each layer containing graphite;
    a housing forming a heat radiation portion, the housing being configured to house the graphite laminate; and
    a heat source disposed within the housing,
    wherein the graphite laminate has a portion in a stepwise form in which edges of the plurality of layers are offset from each other,
    the portion is thermally connected to at least one of the heat source and the heat radiation portion, and forms the stepwise form in the first direction with respect to a corresponding one of the heat source and the heat radiation portion, and
    the portion includes
    a first portion forming an end portion of the graphite laminate toward a second direction orthogonal to the first direction and being thermally connected to the heat source, and
    a second portion forming an end portion of the graphite laminate toward a third direction orthogonal to the first direction at a position away from the first portion and thermally connected to the heat radiation portion.

3. The electronic device as claimed in claim 2, further comprising:
    a first heat transfer member disposed between the first portion and the heat source in the first direction to contact the first portion; and
    a second heat transfer member disposed between the second portion and the heat radiation portion in the first direction to contact the second portion.

4. The electronic device as claimed in claim 3, wherein each of the first heat transfer member and the second heat transfer member is a thermal interface material.

5. The electronic device as claimed in claim 2, further comprising:
    a first contact portion made of the housing or a member within the housing, the first contact portion being at a position opposite to the heat source across the first portion in the first direction to contact the first portion in the first direction; and
    a second contact portion made of the housing or a member within the housing, the second contact portion being at a position opposite to the heat radiation portion across the second portion in the first direction to contact the second portion in the first direction.

6. The electronic device as claimed in claim 5, wherein at least one of the first contact portion and the second contact portion is formed by a protruded portion of the housing.

7. The electronic device as claimed in claim 5, further comprising:
    a first elastic member disposed between the first portion and the first contact portion in the first direction, the first elastic member being elastically deformable in the first direction; and
    a second elastic member disposed between the second portion and the second contact portion in the first direction, the second elastic member being elastically deformable in the first direction.

8. The electronic device as claimed in claim 5, wherein the first contact portion has a first inclined surface or a first stepped surface that approaches the heat source in the first direction as the first contact portion approaches an edge of the first portion in the second direction, and the second contact portion has a second inclined surface or a second stepped surface that approaches the heat radiation portion in the first direction as the second contact portion approaches an edge of the second portion in the third direction.

9. The electronic device as claimed in claim 1, wherein the electronic device is an optical transceiver.

* * * * *